(12) United States Patent
Hwang et al.

(10) Patent No.: US 11,658,656 B2
(45) Date of Patent: May 23, 2023

(54) LOW POWER CLOCK GATING CELL AND AN INTEGRATED CIRCUIT INCLUDING THE SAME

(71) Applicant: SAMSUNG ELECTRONICS CO., LTD., Suwon-si (KR)

(72) Inventors: Hyunchul Hwang, Suwon-si (KR); Youngo Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/515,607

(22) Filed: Nov. 1, 2021

(65) Prior Publication Data

US 2022/0166427 A1 May 26, 2022

(30) Foreign Application Priority Data

| Nov. 26, 2020 | (KR) | ......................... 10-2020-0161569 |
| Dec. 2, 2020 | (KR) | ......................... 10-2020-0166964 |
| Apr. 13, 2021 | (KR) | ......................... 10-2021-0048027 |
| Aug. 11, 2021 | (KR) | ......................... 10-2021-0106184 |

(51) Int. Cl.
*H03K 17/687* (2006.01)
*H03K 3/356* (2006.01)

(52) U.S. Cl.
CPC ......... *H03K 17/6871* (2013.01); *H03K 3/356* (2013.01)

(58) Field of Classification Search
CPC .......................... H03K 3/356; H03K 17/6871
See application file for complete search history.

(56) References Cited

U.S. PATENT DOCUMENTS

| 5,642,061 | A | 6/1997 | Gorny |
| 5,900,759 | A | 5/1999 | Tam |
| 6,374,393 | B1 | 4/2002 | Hirairi |
| 6,664,836 | B1 | 12/2003 | Wen |
| 7,429,880 | B2 | 9/2008 | Rana et al. |
| 8,030,969 | B2 | 10/2011 | Sumita |
| 8,169,246 | B2 | 5/2012 | Malik et al. |
| 9,362,910 | B2 | 6/2016 | Gurumurthy et al. |
| 10,367,507 | B2 | 7/2019 | Bunce et al. |
| 10,461,747 | B2 | 10/2019 | Venugopal et al. |

(Continued)

FOREIGN PATENT DOCUMENTS

| KR | 10-0198962 | 3/1999 |
| KR | 10-2020-0110161 | 9/2020 |

*Primary Examiner* — Metasebia T Retebo
(74) *Attorney, Agent, or Firm* — F. Chau & Associates, LLC

(57) ABSTRACT

A clock gating cell including: a first circuit configured to receive an enable signal and an inverted output clock signal and generate a first signal through a first node; a second circuit configured to receive the first signal and generate an inverted first signal; a third circuit configured to receive the first signal, the inverted first signal, and an input clock signal, generate the first signal by being connected to the first circuit through the first node, and generate the inverted output clock signal through a second node; and a fourth circuit configured to receive the first signal, generate the inverted output clock signal by being connected to the third circuit through the second node, and generate the output clock signal, wherein the third circuit includes a pair of transistors receiving the input clock signal.

19 Claims, 21 Drawing Sheets

(56) References Cited

U.S. PATENT DOCUMENTS

| | | |
|---|---|---|
| 10,491,217 B2 | 11/2019 | Hsu et al. |
| 10,784,864 B1 | 9/2020 | Berzins et al. |
| 10,819,342 B2 | 10/2020 | Berzins et al. |
| 2005/0083082 A1 | 4/2005 | Olofsson |
| 2009/0237137 A1 | 9/2009 | Kim |
| 2018/0062658 A1 | 3/2018 | Hsu et al. |
| 2020/0186131 A1 | 6/2020 | Rengarajan et al. |
| 2020/0295758 A1* | 9/2020 | Berzins ................ G06F 1/3237 |

* cited by examiner

LOW POWER CLOCK GATING CELL AND AN INTEGRATED CIRCUIT INCLUDING THE SAME

CROSS-REFERENCE TO RELATED APPLICATIONS

This application claims priority under 35 U.S.C. § 119 to Korean Patent Application No. 10-2020-0161569, filed on Nov. 26, 2020, Korean Patent Application No. 10-2020-0166964, filed on Dec. 2, 2020, Korean Patent Application No. 10-2021-0048027, filed on Apr. 13, 2021, and Korean Patent Application No. 10-2021-0106184, filed on Aug. 11, 2021 in the Korean Intellectual Property Office, the disclosures of which are incorporated by reference herein in their entireties.

TECHNICAL FIELD

The inventive concept relates to a clock gating cell, and more particularly, to a clock gating cell with low power consumption and an integrated circuit including the same.

DISCUSSION OF RELATED ART

In a clock synchronization system including a clock network, a clock gating cell may be used as a digital circuit for supplying a clock signal. Because a clock gating cell selectively outputs a clock signal in response to a control signal, the system's power efficiency may be increased through an operation of the clock gating cell.

However, a clock gating cell still consumes power due to a clock signal even when no clock signal is output.

SUMMARY

The inventive concept provides a clock gating cell that includes a pair of transistors and receives a clock signal for reduced power consumption and an integrated circuit including the same.

According to an example embodiment of the inventive concept, there is provided a clock gating cell including: a first circuit configured to receive an enable signal and an inverted output clock signal and generate a first signal through a first node; a second circuit configured to receive the first signal and generate an inverted first signal; a third circuit configured to receive the first signal, the inverted first signal, and an input clock signal, generate the first signal by being connected to the first circuit through the first node, and generate the inverted output clock signal through a second node; and a fourth circuit configured to receive the first signal, generate the inverted output clock signal by being connected to the third circuit through the second node, and generate the output clock signal, wherein the third circuit includes a pair of transistors receiving the input clock signal.

According to an example embodiment of the inventive concept, there is provided an integrated circuit including a clock gating cell that receives at least one control signal and an input clock signal and generates an output clock signal, wherein the clock gating cell includes: a first circuit including a first function circuit configured to generate a first signal through a first node based on the at least one control signal and a first keeper circuit configured to maintain a voltage level of the first signal; a second circuit configured to receive the first signal and generate an inverted first signal; a third circuit including a second function circuit configured to generate the first signal through the first node based on the at least one control signal, a second keeper circuit configured to maintain a voltage level of the first signal, a first charge circuit configured to generate an inverted output clock signal by charging a second node based on the first signal, and a discharge circuit configured to discharge the second node; and a fourth circuit including a second charge circuit configured to generate the inverted output clock signal by charging the second node based on the first signal, and the third circuit includes a pair of transistors receiving the input clock signal.

According to an example embodiment of the inventive concept, there is provided a latch circuit including: a first circuit configured to receive an inverted output clock signal and a data signal and generate a first signal through a first node; a second circuit configured to receive the data signal, an input clock signal, and an output signal, generate the first signal by being connected to the first circuit through the first node, and generate the inverted output clock signal through a second node; a third circuit configured to generate the inverted output clock signal by being connected to the second circuit through the second node; and a fourth circuit configured to receive the first signal and generate an output signal and an inverted output signal, wherein the second circuit includes a pair of transistors receiving the input clock signal.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
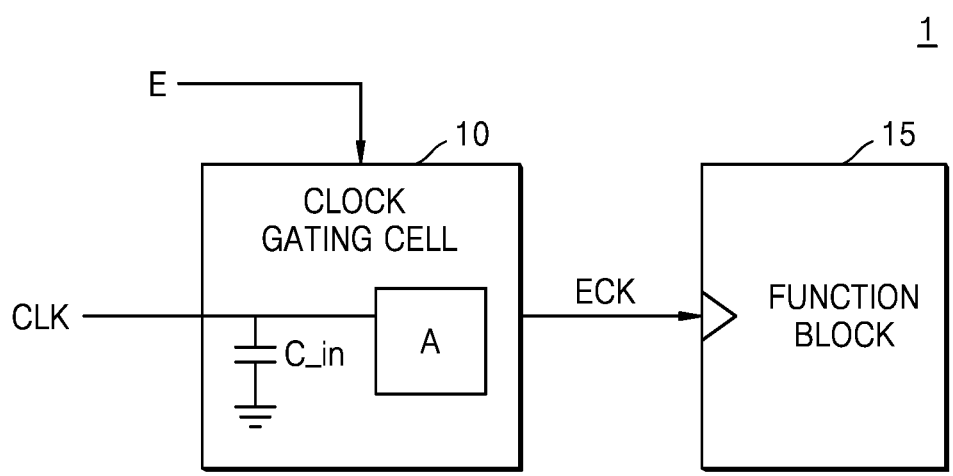
FIG. 1 is a block diagram showing an integrated circuit (IC) according to an example embodiment of the inventive concept.

FIG. 1 is a diagram showing an integrated circuit (IC) according to an example embodiment of the inventive concept.

Referring to FIG. 1, a clock gating cell 10 may be included in an IC 1 manufactured through a semiconductor process. The clock gating cell 10 may also be referred to as a clock gating circuit or an integrated clock gating (ICG) cell. In the present specification, the term "clock gating" may refer to suspending or resuming an operation of a digital circuit by selectively providing an output clock signal to a functional block.

The clock gating cell 10 may receive an input clock signal CLK and an enable signal E and generate an output clock signal ECK. The clock gating cell 10 may be set to an enable state or a disable state according to the enable signal E. For example, the clock gating cell 10 may be set to the disable state when the enable signal E is at a first logic level (e.g., a logic low level). The clock gating cell 10 in the disable state may generate the output clock signal ECK of a constant level.

For example, the clock gating cell 10 may be set to the enable state when the enable signal E is at a second logic level (e.g., a logic high level). The clock gating cell 10 in the enable state may generate the output clock signal ECK that is toggled according to the input clock signal CLK.

The clock gating cell 10 may generate the output clock signal ECK and supply the output clock signal ECK to a functional block 15. The functional block 15 may refer to a digital circuit that operates in response to a negative edge or a positive edge of the output clock signal ECK. For example, the functional block 15 may be a positive edge triggered flipflop or a negative edge triggered flipflop.

The clock gating cell 10 may include a circuit element for directly receiving the input clock signal CLK. Although FIG. 1 shows one circuit element, e.g., A, a plurality of circuit elements may be provided. As the number of circuit elements for receiving an input clock signal increases, the capacitance due to the input clock signal CLK increases, and thus the self-power consumption of the clock gating cell 10 may increase.

The clock gating cell 10 according to the present embodiment may reduce the capacitance due to the input clock signal CLX by reducing the number of circuit elements that directly receive the input clock signal CLK. Therefore, the power consumption of the clock gating cell 10 caused by the input clock signal CLK may be reduced, and thus, a low power clock gating cell may be implemented.

Figure 2:
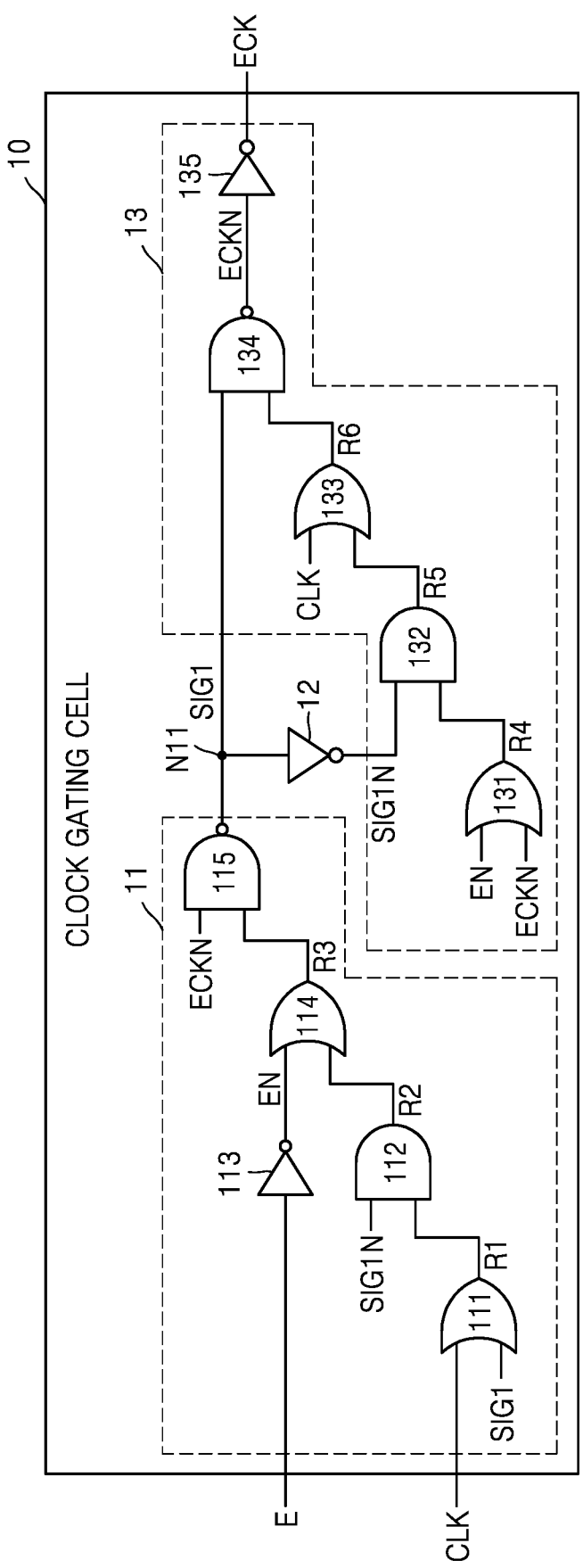
FIG. 2 is a logic diagram of a clock gating cell according to an example embodiment of the inventive concept.

FIG. 2 is a logic diagram of a clock gating cell according to an example embodiment of the inventive concept.

Referring to FIG. 2, the clock gating cell 10 may include a first circuit 11, a first inverter 12, and a second circuit 13. The logic diagram of FIG. 2 may be implemented in various circuit configurations.

The first circuit 11 may receive an enable signal E, an input clock signal CLK, a first signal SIG1, an inverted first signal SIG1N, and an inverted output clock signal ECKN and may be connected to an intermediate node N11. For example, the first signal SIG1 may be generated from the intermediate node N11. In other words, the first signal SIG1 may be a signal at the intermediate node N11.

For example, the first circuit 11 may include a first OR gate 111 that receives the input clock signal CLK and the first signal SIG1 and generates a first result signal R1, a first AND gate 112 that receives the inverted first signal SIG1N and the first result signal R1 and generates a second result signal R2, a second inverter 113 that generates an inverted enable signal EN by inverting the enable signal E, a second OR gate 114 that receives the inverted enable signal EN of the second inverter 113 and the second result signal R2 and generates a third result signal R3, and a first NAND gate 115 that receives the third result signal R3 and the inverted output clock signal ECKN and generates the first signal SIG1. The first inverter 12 may generate the inverted first signal SIG1N by inverting the first signal SIG1.

The second circuit 13 may receive the inverted enable signal EN, the inverted first signal SIG1N, the input clock signal CLK, and the first signal SIG1 and generate the output clock signal ECK.

For example, the second circuit 13 may include a third OR gate 131 that receives the inverted enable signal EN and the inverted output clock signal ECKN and generates a fourth result signal R4, a second AND gate 132 that receives the inverted first signal SIG1N and the fourth result signal R4 and generates a fifth result signal R5, a fourth OR gate 133 that receives the input clock signal CLK and the fifth result signal R5 and generates a sixth result signal R6, a second NAND gate 134 that receives the first signal SIG1 and the sixth result signal R6 and generates the inverted output clock signal ECKN, and a third inverter 135 that generates the output clock signal ECK by inverting the inverted output clock signal ECKN.

In FIG. 2, gates that directly receive the input clock signal CLK in the clock gating cell 10 are the first OR gate 111 of the first circuit 11 and the fourth OR gate 133 of the second circuit 13. The logic diagram of FIG. 2 is not limited to any circuit diagram, but, in the case of a configuration in which the input clock signal CLK is input to two gates, power consumption of the clock gating cell 10 may increase due to the input clock signal CLK.

According to the present embodiment to be described in more detail below, a plurality of gates for receiving the input clock signal CLK may be merged to implement the clock gating cell 10 including only a pair of transistors (in other words, two transistors) directly receiving the input clock signal CLK. Therefore, power consumption of the clock gating cell 10 may be reduced, and, as the clock gating cell 10 of low power is implemented, power consumption of the IC 1 including the clock gating cell 10 may also be reduced.

Figure 3A:
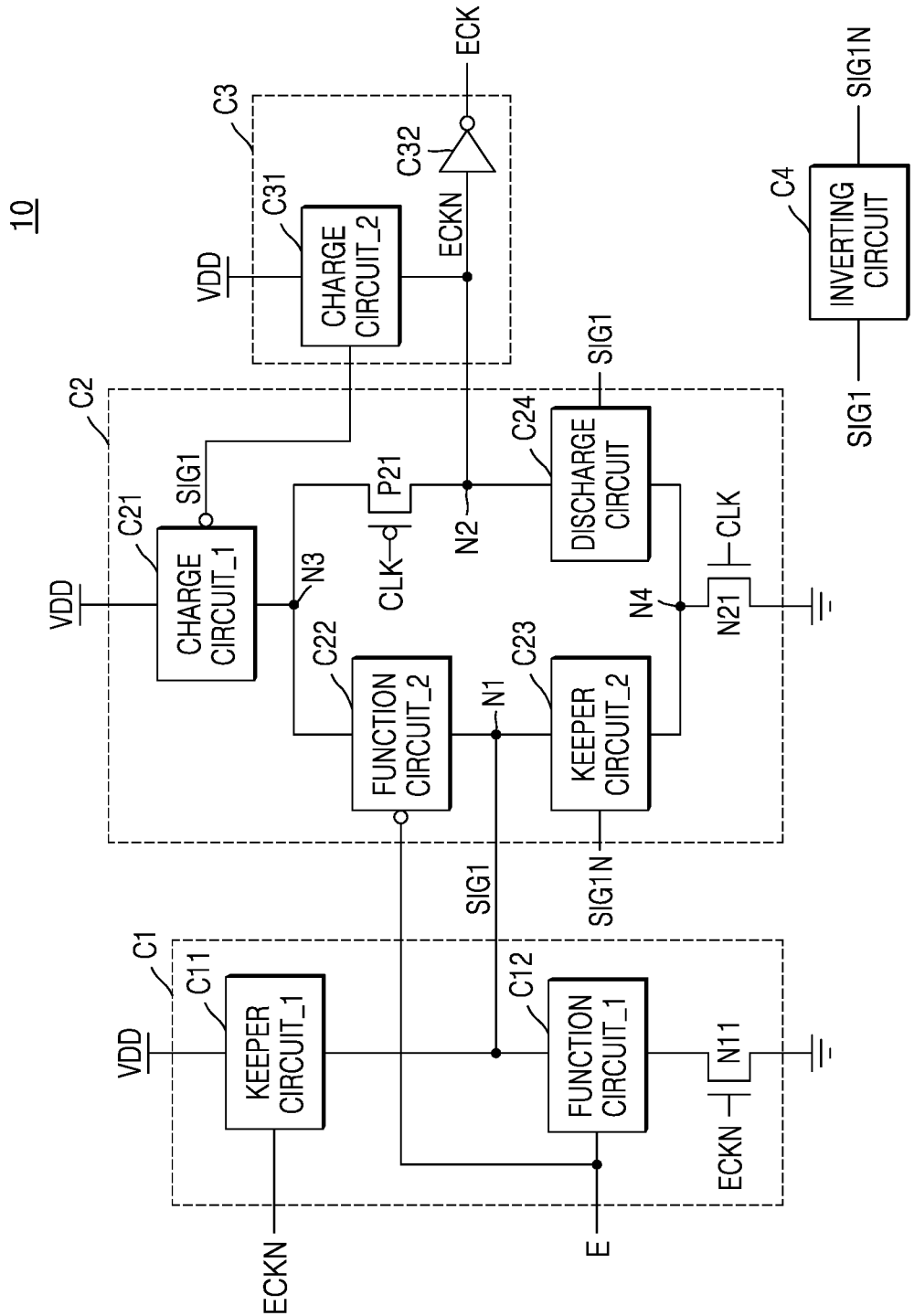
FIGS. 3A and 3B are circuit diagrams of clock gating cells according to example embodiments of the inventive concept.
Figure 3B:
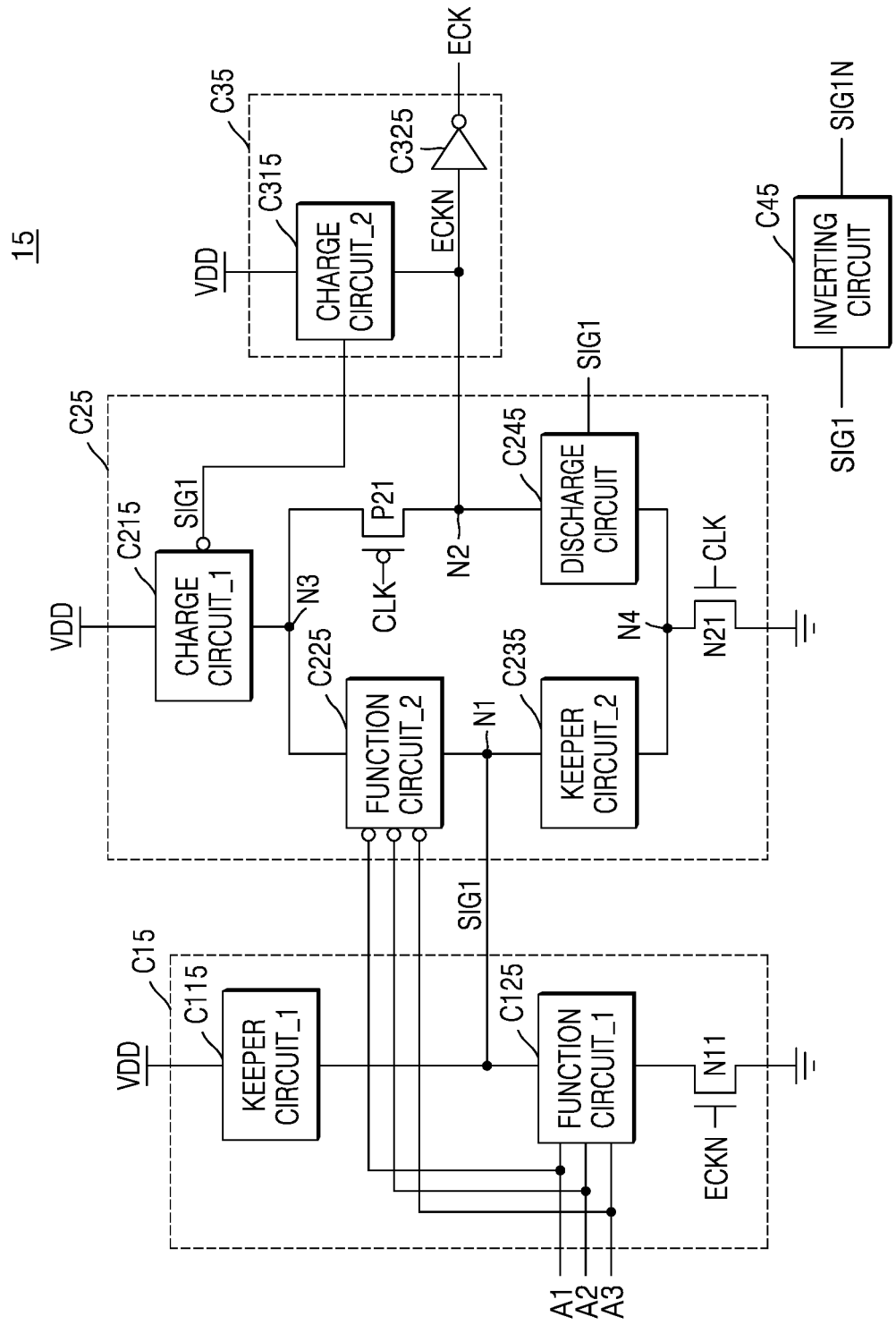

FIGS. 3A and 3B are circuit diagrams of clock gating cells according to example embodiments of the inventive concept.

FIG. 3A is a circuit diagram of the clock gating cell 10 of FIG. 2 according to an example embodiment. The clock gating cell 10 may include first, second, third and fourth blocks C1, C2, C3 and C4.

The first block C1 may include a first keeper circuit C11 and a first function circuit C12, the second block C2 may include a first charge circuit C21, a second function circuit C22, a second keeper circuit C23, and a discharge circuit C24, and the third block C3 may include a second charge circuit C31.

In the present specification, a keeper circuit may refer to a circuit that maintains a voltage level of a particular node at a certain value. A charge circuit may refer to a circuit that charges a voltage level of a particular node to a logic high level, and a discharge circuit may refer to a circuit that discharges a voltage level of a particular node to a logic low level. A function circuit may refer to a circuit that performs a logic operation based on an input signal and operates according to a result of the operation.

In addition, the first and second keeper circuits C11 and C23, the first and second function circuits C12 and C22, the first and second charge circuits C21 and C31, and the discharge circuit C24 may each be implemented with one transistor as described below with reference to FIG. 4, but the inventive concept is not limited thereto.

The first block C1 may receive the enable signal E and the inverted output clock signal ECKN and may be connected to a power voltage node VDD, a first node N1, and a ground node. As shown in FIG. 3A, the first signal SIG1 may be generated by the first node N1. In other words, the first signal SIG1 may be generated through the first node N1.

For example, the first block C1 may include the first keeper circuit C11, the first function circuit C12, and a first transistor N11.

The first keeper circuit C11 may receive the inverted output clock signal ECKN and may be connected to the power voltage node VDD and the first node N1. For example, the first keeper circuit C11 may maintain the first signal SIG1 of the first node N1 at a particular logic level according to the inverted output clock signal ECKN. In other words, the first keeper circuit C11 may maintain the first signal SIG1 of the first node N1 at a particular logic level in response to the inverted output clock signal ECKN.

The first function circuit C12 may receive the enable signal E and may be connected to the first node N1 and a source of the first transistor N11. For example, the first function circuit C12 may generate the inverted enable signal EN by inverting the received enable signal E and control the logic level of the first signal SIG1 of the first node N1 according to the inverted enable signal EN.

Although FIG. 2 shows that the first function circuit C12 receives one enable signal E, the inventive concept is not limited thereto, and the first function circuit C12 may be connected to a plurality of signal lines and receive a plurality of other signals. For example, the first function circuit C12 may receive the enable signal E and a scan enable signal (e.g., SE of FIG. 10) instructing a test operating mode of the clock gating cell 10.

The first transistor N11 may receive the inverted output clock signal ECKN and may be connected to the first function circuit C12 and the ground node. For example, the first transistor N11 may be connected between the first function circuit C12 and the ground node and may be controlled by the inverted output clock signal ECKN applied to its gate.

The second block C2 may receive the inverted enable signal EN, the inverted first signal SIG1N, and the input clock signal CLK and may be connected to the power voltage node VDD, the first node N1, a second node N2, and the ground node. For example, the inverted output clock signal ECKN may be generated by the second node N2.

For example, the second block C2 may include the first charge circuit C21, the second function circuit C22, the second keeper circuit C23, second and third transistors P21 and N21, and the discharge circuit C24.

The first charge circuit C21 may receive the first signal SIG1 and may be connected to the power voltage node VDD and a third node N3. For example, the first charge circuit C21 may charge the second node N2 by turning ON/OFF the second transistor P21 connected through the third node N3. For example, the first charge circuit C21 may charge the first node N1 according to a result of an operation of the second function circuit C22. Therefore, for example, the logic level of the first signal SIG1 generated by the first node N1 may be a logic high level. In FIG. 3A, the circle shown at the first charge circuit C21 may denote an inverter. Therefore, the first charge circuit C21 may use the inverted first signal SIG1N.

The second function circuit C22 may receive the enable signal E and may be connected to the first node N1 and the third node N3. In FIG. 3A, the circle shown at the second function circuit C22 may denote an inverter. Therefore, the second function circuit C22 may use the inverted enable signal EN.

Although FIG. 3A shows that the second function circuit C22 receives one inverted enable signal EN, the inventive concept is not limited thereto, and the second function circuit C22 may receive a plurality of other signals. For example, the second function circuit C22 may receive the inverted enable signal EN and an inverted scan enable signal. In addition, as shown in FIG. 2, polarities of respective signals for controlling the first function circuit C12 and the second function circuit C22 may be opposite to each other.

The second keeper circuit C23 may receive the inverted first signal SIG1N and may be connected to the first node N1 and a fourth node N4. For example, the second keeper circuit C23 may maintain the first signal SIG1 of the first node N1 at a particular logic level according to the inverted first signal SIG1N.

The second transistor P21 may receive the input clock signal CLK and may be connected to the second node N2 and the third node N3. For example, the second transistor P21 may be connected between the second node N2 and the third node N3 and may be controlled by the input clock signal CLK applied to its gate.

The third transistor N21 may receive the input clock signal CLK and may be connected to the fourth node N4 and the ground node. For example, the third transistor N21 may be connected between the fourth node N4 and the ground node and may be controlled by the input clock signal CLK applied to its gate.

The discharge circuit C24 may receive the first signal SIG1 and may be connected to the second node N2 and the fourth node N4. For example, the discharge circuit C24 may discharge the second node N2 by turning ON/OFF the third transistor N21 connected through the fourth node N4. Therefore, for example, the logic level of the inverted output clock signal ECKN generated by the second node N2 may be a logic low level.

The third block C3 may receive the first signal SIG1 and the inverted output clock signal ECKN, may generate the output clock signal ECK, and may be connected to the second node N2 and the power voltage node VDD. According to an example embodiment of the inventive concept, the third block C3 may include the second charge circuit C31 and an inverter C32.

The second charge circuit C31 may receive the first signal SIG1 and may be connected to the power voltage node VDD and the second node N2. For example, the second charge circuit C31 may charge the second node N2. Therefore, for example, the logic level of the inverted output clock signal ECKN generated by the second node N2 may be a logic high level.

The inverter C32 may generate the output clock signal ECK by inverting the inverted output clock signal ECKN. Here, the inverter C32 of the third block C3 may be omitted. In this case, the clock gating cell 10 may generate the inverted output clock signal ECKN instead of the output clock signal ECK.

The fourth block C4 may generate the inverted first signal SIG1N by inverting the first signal SIG1. The fourth block C4 may be implemented by an inverting circuit.

The first charge circuit C21 and the second charge circuit C31 may determine the logic level of the first signal SIG1 and the logic level of the inverted output clock signal ECKN under the control of the second transistor P21.

For example, when the logic level of the input clock signal CLK is a logic low level, the second transistor P21 may be turned on by the input clock signal CLK and the first charge circuit C21 may determine the logic level of the inverted output clock signal ECKN of the second node N2.

For example, when the logic level of the input clock signal CLK is a logic high level, the second transistor P21 may be turned off by the input clock signal CLK and the first charge circuit C21 is unable to determine the logic level of the inverted output clock signal ECKN of the second node N2. In this case, the second charge circuit C31 may determine the logic level of the inverted output clock signal ECKN of the second node N2.

For example, when the logic level of the input clock signal CLK is a logic low level, the second transistor P21 may be turned on by the input clock signal CLK. In this case, based on the ON/OFF state of the second function circuit C22, the second charge circuit C31 may determine the logic level of the first signal SIG1 of the first node N1.

In the clock gating cell 10 according to the present embodiment, the first signal SIG1 may be generated by latching the enable signal E according to the input clock signal CLK. For example, the first signal SIG1 may be generated from the enable signal E when the logic level of the input clock signal CLK is a logic low level and may maintain a previous output value when the logic level of the input clock signal CLK is a logic high level.

In addition, the output clock signal ECK may maintain a logic low level when the logic level of the first signal SIG1 is a logic low level and may be generated from the input clock signal CLK when the logic level of the first signal SIG1 is a logic high level.

A clock gating cell according to a comparative example may include a latch circuit and a logic gate and, since the latch circuit and the logic gate each receive the input clock signal CLK directly, power consumption due to the input clock signal CLK is large. On the contrary, according to the present embodiment, the clock gating cell 10 may include only a pair of transistors that receive the input clock signal CLK by merging the input clock signal CLK input to a latch circuit and the input clock signal CLK input to a logic gate. Therefore, parasitic capacitance due to the input clock signal CLK may decrease, and power consumption of the clock gating cell 10 may be reduced.

FIG. 3B may be an alternative embodiment of FIG. 2, wherein a clock gating cell 15 may include first, second, third and fourth blocks C15, C25, C35 and C45.

The first block C15 may include a first keeper circuit C115 and a first function circuit C125, the second block C25 may include a first charge circuit C215, a second function circuit C225, a second keeper circuit C235, and a discharge circuit C245, and the third block C35 may include a second charge circuit C315.

Unlike in FIG. 3A, signals for controlling the first keeper circuit C115, the second keeper circuit C235, and the discharge circuit C245 may not each be limited to any one signal.

In addition, a plurality of control signals A1, A2, and A3 may be used to control the first function circuit C125 and the second function circuit C225, and any one of the control signals A1, A2, and A3 may be the enable signal E. Although FIG. 3B shows three control signals, the number of control signals is not limited thereto.

In detail, the first block CIS may include the first function circuit C125 configured to generate the first signal SIG1 through the first node N1 based on at least one of the control signals A1, A2, and A3 and the first keeper circuit C115 configured to maintain the voltage level of the first signal SIG1.

The second block C25 may include the second function circuit C225 configured to generate the first signal SIG1 through the first node N1 based on at least one of the control signals A1, A2, and A3, the second keeper circuit C235 configured to maintain the voltage level of the first signal SIG1, the first charge circuit C215 configured to generate the inverted output clock signal ECKN by charging the second node N2 based on the first signal SIG1, and the discharge circuit (245 configured to discharge the second node N2.

The third block C35 may include the second charge circuit C315 configured to generate the inverted output clock signal ECKN by charging the second node N2 based on the first signal SIG1.

The fourth block C45 may be configured to receive the first signal SIG1 and generate the inverted first signal SIG1N.

Figure 4:
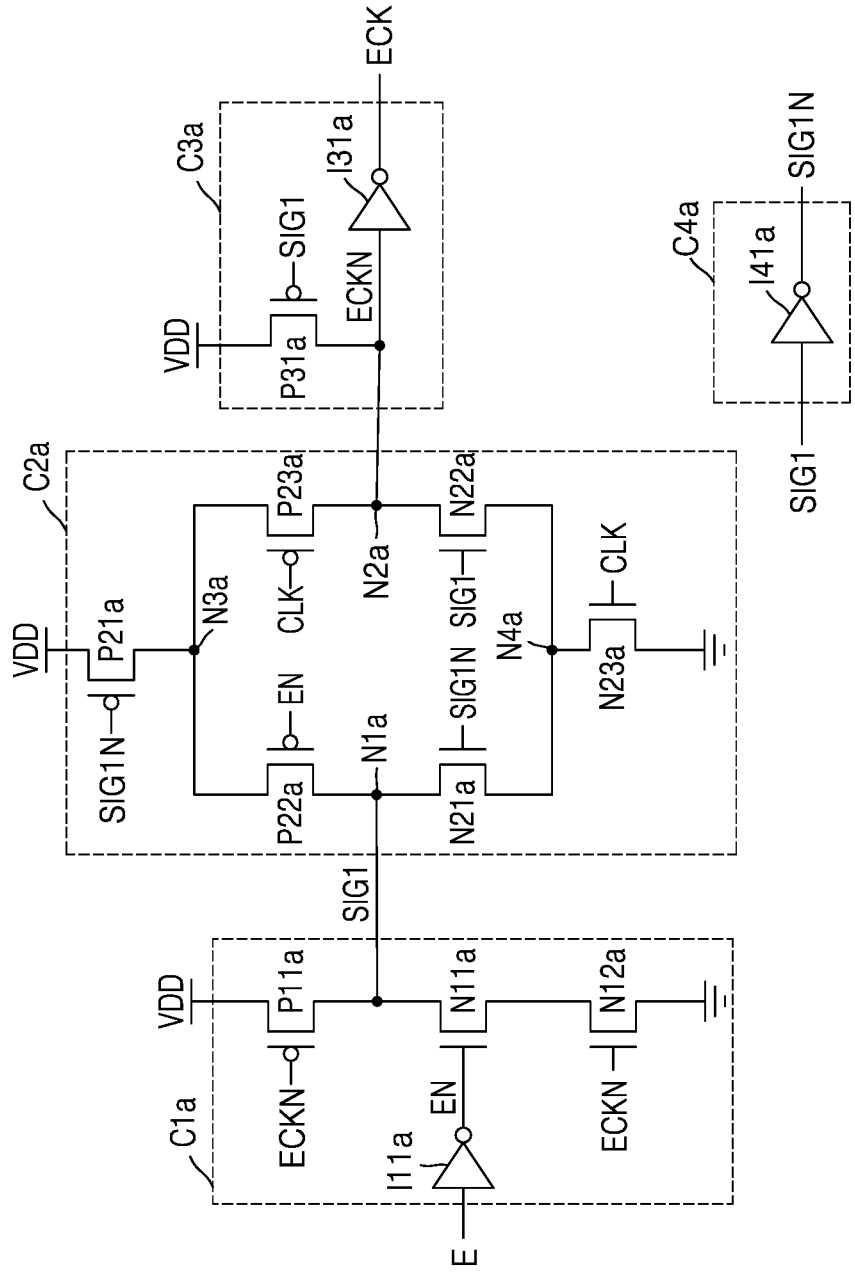
FIG. 4 is a circuit diagram of a clock gating cell according to an example embodiment of the inventive concept.

FIG. 4 is a circuit diagram of a clock gating cell according to an example embodiment of the inventive concept.

Referring to FIG. 4, a clock gating cell 10a may include first, second, third and fourth blocks C1a, C2a, C3a and C4a. FIG. 4 may correspond to an embodiment of FIG. 3A, and descriptions identical to those of FIG. 2 may be omitted below. In addition, in this specification, transistors may have structures that provide complementary transistors (e.g., an n-channel transistor and a p-channel transistor), and, as non-limiting examples, may be implemented as planar field effect transistors (FETs), fin field effect transistors (Fin-FETs), gate all around field effect transistors (GAAFETs), vertical field effect transistors (VFETs), etc.

The first block C1a may include an inverter I11a, a first PFET transistor P11a, and first and second NFET transistors N11a and N12a.

The inverter I11a may generate the inverted enable signal EN by inverting the enable signal E. The first PFET transistor P11a may be connected between the power voltage node VDD and a first node N1a and may be controlled by the inverted output clock signal ECKN applied to its gate. The first and second NFET transistors N11a and N12a may be connected in series between the first node N1a and the ground node and may be controlled by the inverted enable signal EN and the inverted output clock signal ECKN, respectively. For example, the inverted enable signal EN may be applied to the gate of the first NFET transistor N11a, and the inverted output clock signal ECKN may be applied to the gate of the second NFET transistor N12a.

The second block C2a may include third, fourth and fifth PFET transistors P21a, P22a, and P23a and third, fourth and fifth NFET transistors N21a, N22a, and N23a.

The third PFET transistor P21a may be connected between the power voltage node VDD and a third node N3a and may be controlled by the inverted first signal SIG1N applied to its gate. The fourth PFET transistor P22a may be connected between the third node N3a and the first node N1a and may be controlled by the inverted enable signal EN applied to its gate. The fifth PFET transistor P23a may be connected between the third node N3a and a second node N2a and may be controlled by the input clock signal CLK applied to its gate.

The third NFET transistor N21a may be connected between the first node N1a and a fourth node N4a and may be controlled by the inverted first signal SIG1N applied to its gate. The fourth NFET transistor N22a may be connected between the second node N2a and the fourth node N4a and may be controlled by the first signal SIG1 applied to its gate. The fifth NFET transistor N23a may be connected between the fourth node N4a and the ground node and may be controlled by the input clock signal CLK applied to its gate.

The third block C3a may include a sixth PFET transistor P31a and an inverter I31a. The sixth PFET transistor P31a may be connected between the power voltage node VDD and the second node N2a and may be controlled by the first signal SIG1 applied to its gate. The inverter I31a may generate the output clock signal ECK by inverting the inverted output clock signal ECKN.

The fourth block C4a may include an inverter I41a. The inverter I41a may generate the inverted first signal SIG1N by inverting the first signal SIG1.

Since the clock gating cell 10a according to the present embodiment includes only one pair of transistors directly receiving the input clock signal CLK, the clock gating cell 10a may have a simplified layout. In other words, connections to clock pins through gate lines may be minimized.

For example, the layout of the clock gating cell 10a may include only one pair of gate lines to which the input clock signal CLK is applied, and signals other than the input clock signal CLK may be input to gate lines of transistors adjacent to the fifth PFET transistor P23a and the fifth NFET transistor N23a.

In addition, in FIG. 4, a source and a drain of the fifth PFET transistor P23a receiving the input clock signal CLK may be connected to a node inside a circuit instead of the power voltage node VDD or the ground node. A source of the fifth NFET transistor N23a may also be connected to a node inside a circuit.

Figure 5:
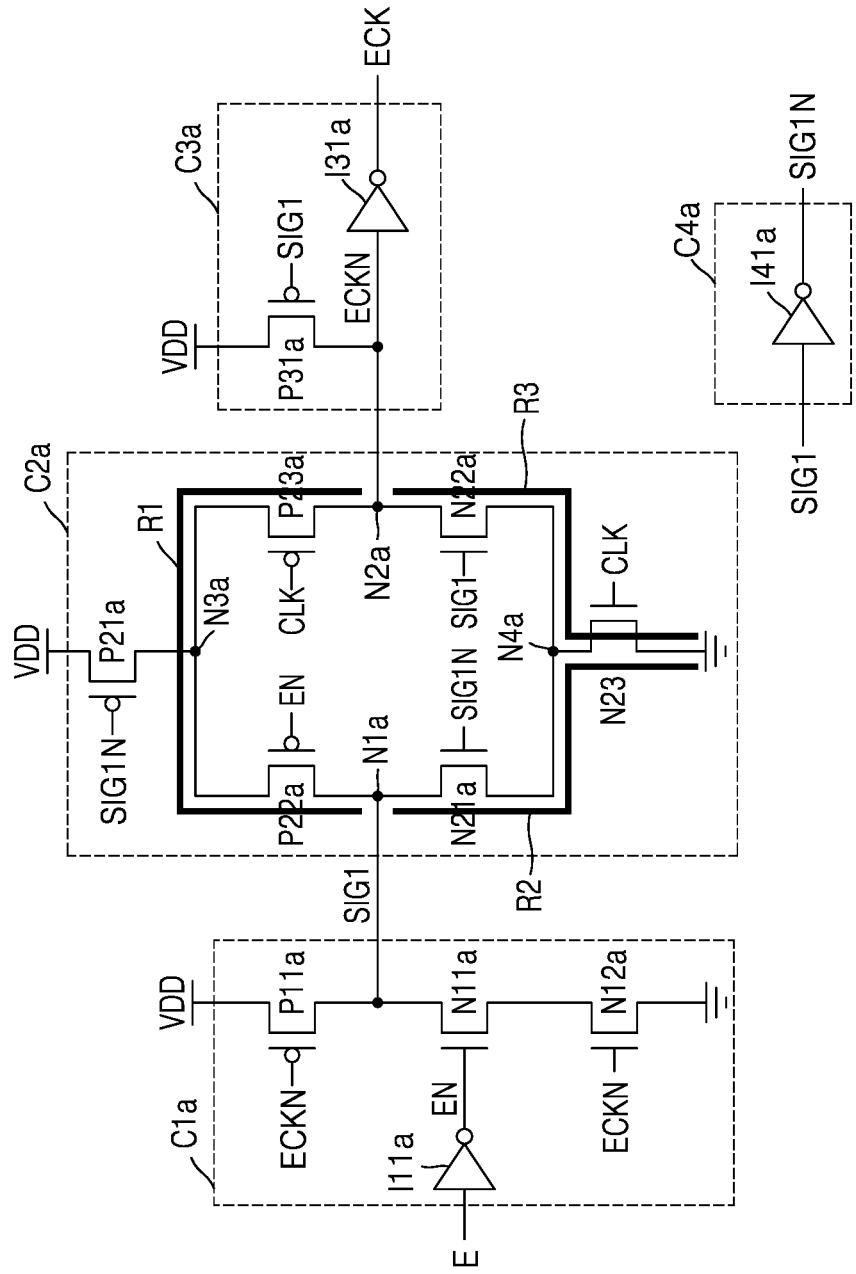
FIG. 5 is a diagram showing an operation of a clock gating cell according to an example embodiment of the inventive concept.

FIG. 5 is a diagram showing an operation of a clock gating cell according to an example embodiment of the inventive concept.

Referring to FIG. 5, the fifth PFET transistor P23a and the fifth NFET transistor N23a that receive the input clock signal CLK may determine logic levels of the first signal SIG1 generated by the first node N1a and the inverted output clock signal ECKN generated by the second node N2a. For example, the fifth PFET transistor P23a may control a charging path of the first node N1a and the second node N2a based on the input clock signal CLK, and the fifth NFET transistor N23a may control a discharging path of the first node N1a and the second node N2a based on the input clock signal CLK.

The fifth PFET transistor P23a may determine the logic level of the first signal SIG1 generated by the first node N1a through a first route R1. For example, the first route R1 may represent a charging path of the first signal SIG.

In addition, the fifth PFET transistor P23a may determine the logic level of the inverted output clock signal ECKN generated by the second node N2a.

The fifth NFET transistor N23a may determine the logic level of the first signal SIG1 generated by the first node N1a through a second route R2. For example, the second route R2 may represent a discharging path of the first signal SIG1.

In addition, the fifth PFET transistor P23a may determine the logic level of the inverted output clock signal ECKN generated by the second node N2a through a third route R3. For example, the third route R3 may represent a discharging path of the inverted output clock signal ECKN.

As described above, since one transistor controls the charging or discharging of two signals, the number of circuit elements directly receiving an input clock signal may be reduced. In other words, the number of clock pins and the clock pin capacitance may be reduced.

Figure 6:
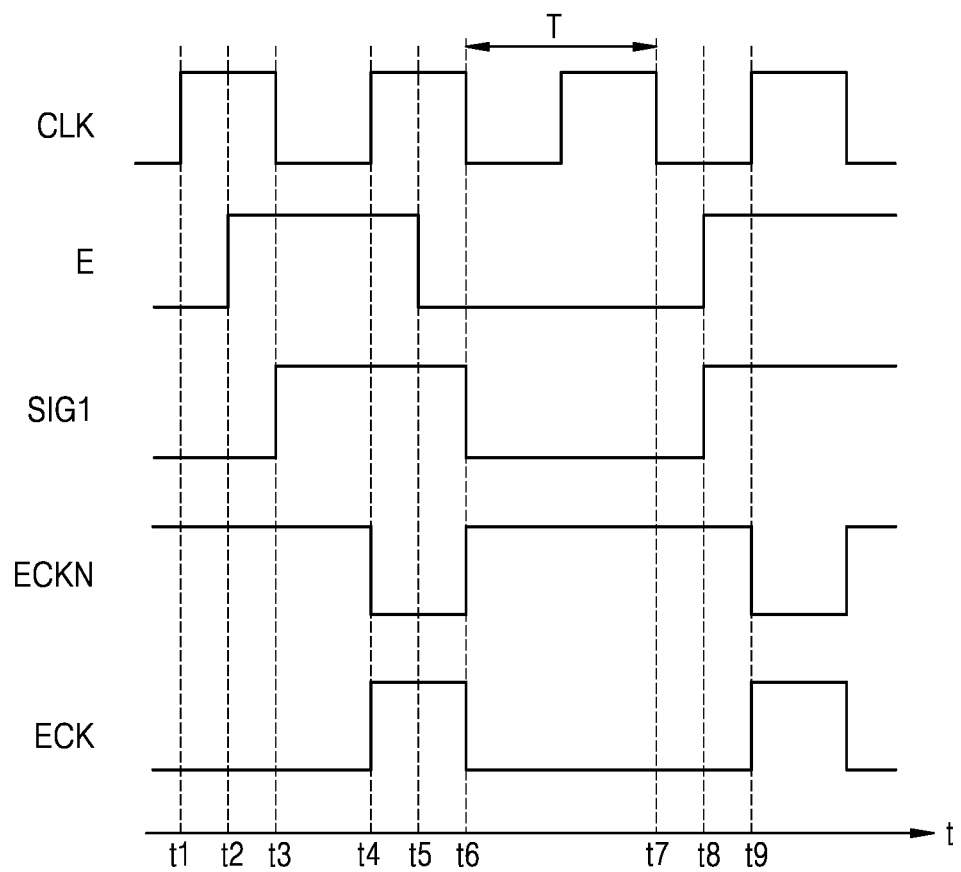
FIG. 6 is a timing diagram for describing an operation of a clock gating cell according to an example embodiment of the inventive concept.

FIG. 6 is a timing diagram for describing an operation of a clock gating cell according to an example embodiment of the inventive concept.

Referring to FIG. 6, signals according to the lapse of time in the clock gating cell 10a of FIG. 4 are shown. In the timing diagram of FIG. 6, a propagation delay may be ignored, and the input clock signal CLK may oscillate according to a period T.

At a time point t1, the input clock signal CLK may transit from a logic low level to a logic high level. The enable signal E may maintain a logic low level, and thus the first signal SIG1 may maintain a logic low level, the inverted output clock signal ECKN may maintain a logic high level, and the output clock signal ECK may maintain a logic low level.

At a time point t2, the enable signal E may transit from the logic low level to a logic high level. The input clock signal CLK may maintain the logic high level, and thus the first signal SIG1 may maintain the logic low level, the inverted output clock signal ECKN may maintain the logic high level, and the output clock signal ECK may maintain the logic low level.

At a time point t3, the input clock signal CLK may transit from the logic high level to the logic low level. The enable signal E may maintain the logic high level, and the first signal SIG1 may transit from the logic low level to a logic high level according to the enable signal E. The inverted output clock signal ECKN may maintain the logic high level, and the output clock signal ECK may maintain the logic low level.

At a time point t4, the input clock signal CLK may transit from the logic low level to the logic high level. The enable signal E may maintain the logic high level, and the first signal SIG1 may also maintain the logic high level. The inverted output clock signal ECKN may transit from the logic high level to a logic low level, and thus the output clock signal ECK may transit from the logic low level to a logic high level.

At a time point t5, the input clock signal CLK may maintain the logic high level, and the enable signal E may transit from the logic high level to the logic low level. In addition, the first signal SIG1 may maintain the logic high level, the inverted output clock signal ECKN may maintain the logic low level and the output clock signal ECK may maintain the logic high level.

At a time point t6, when the input clock signal CLK transits from the logic high level to the logic low level, the first signal SIG1 may transit from the logic high level to the logic low level. In addition, the inverted output clock signal ECKN may transit from the logic low level to the logic high level, and thus the output clock signal ECK may transit from the logic high level to the logic low level.

At a time point t7 after one period T, the input clock signal CLK may transit from the logic high level to the logic low level. The enable signal E may maintain a logic low level, and thus the first signal SIG1 may maintain a logic low level, the inverted output clock signal ECKN may maintain a logic high level, and the output clock signal ECK may maintain a logic low level.

At a time point t8, the input clock signal CLK may maintain the logic low level, and the enable signal E may transit from the logic low level to the logic high level. Therefore, the first signal SIG1 may transit from the logic low level to the logic high level, the inverted output clock signal ECKN may maintain the logic high level, and the output clock signal ECK may maintain the logic low level.

At a time point t9, the input clock signal CLK may transit from the logic low level to the logic high level. The enable signal E may maintain the logic high level, and the first signal SIG1 may maintain the logic high level. The inverted output clock signal ECKN may transit from the logic high level to a logic low level, and thus the output clock signal ECK may transit from the logic low level to a logic high level.

Similar to the clock gating cell according to the comparative example, in the clock gating cells 10, 10a according to the present embodiment, the first signal SIG1, which is generated by latching the enable signal E according to the input clock signal CLK, may be generated, and an operation for generating the output clock signal ECK may be performed based on the first signal SIG1.

While the clock gating cell according to the comparative example includes at least two pairs of transistors for receiving the input clock signal CLK to perform the above-stated operations, the clock gating cells 10, 10a, 10b, 10c, 10d, and 10e according to example embodiments of the inventive concept include only one pair of transistors for receiving the input clock signal CLK each, and thus input capacitance and power consumption due to the input clock signal CLK may be reduced.

FIGS. 7 to 10, 11A, and 11B are circuit diagrams of clock gating cells according to example embodiments of the inventive concept.

Each of clock gating cells 10b, 10c, 10d, 10e, 10f, and 10g of FIGS. 7 to 10, 11A, and 11B is an embodiment of the clock gating cell 10 of FIG. 2 and may correspond to a modified embodiment of the clock gating cell 10a of FIG. 4. Therefore, descriptions identical to those already given above may be omitted below.

Figure 7:
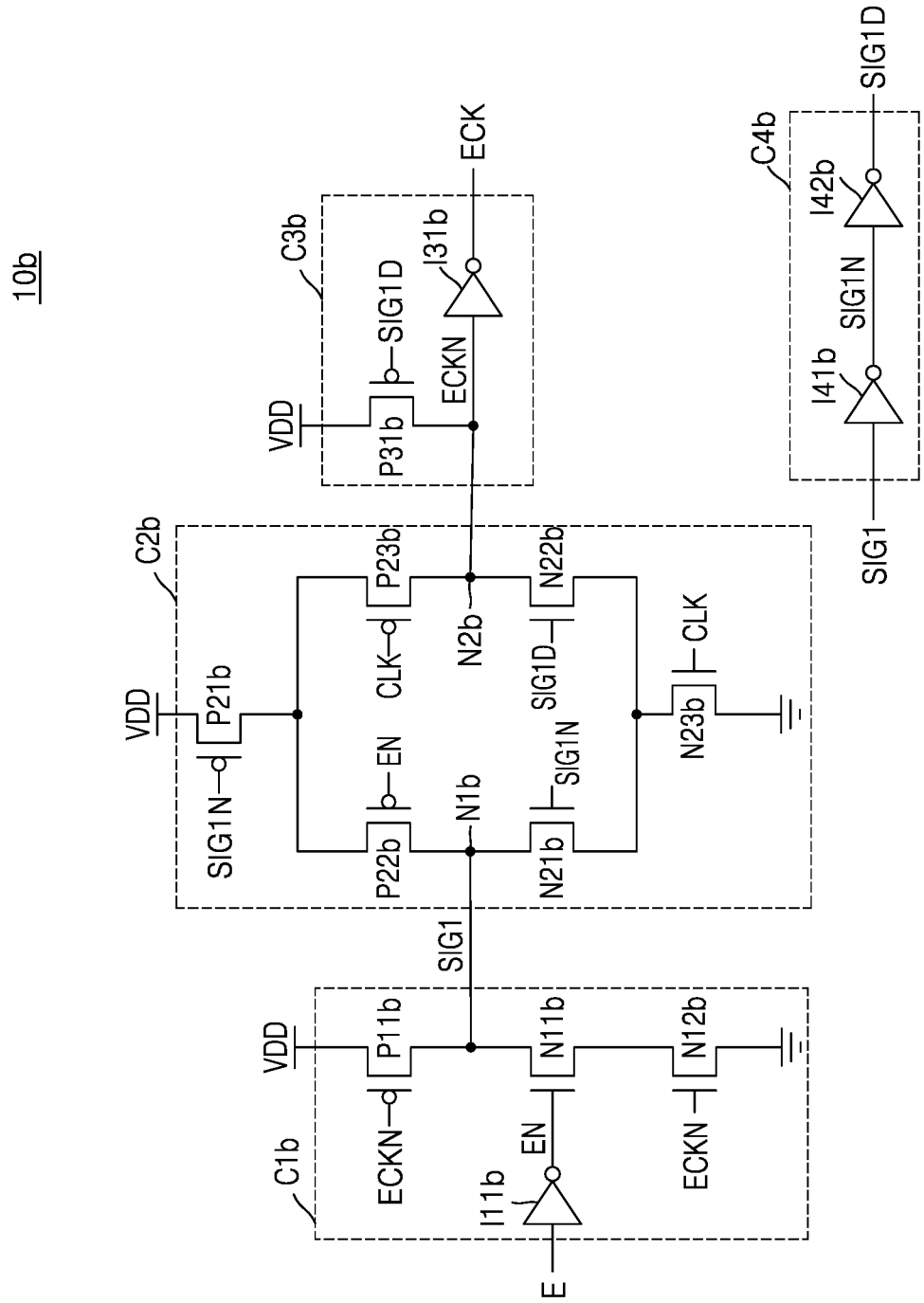
FIGS. 7, 8, 9 10, 11A, and 11B are circuit diagrams of clock gating cells according to example embodiments of the inventive concept.
Figure 8:
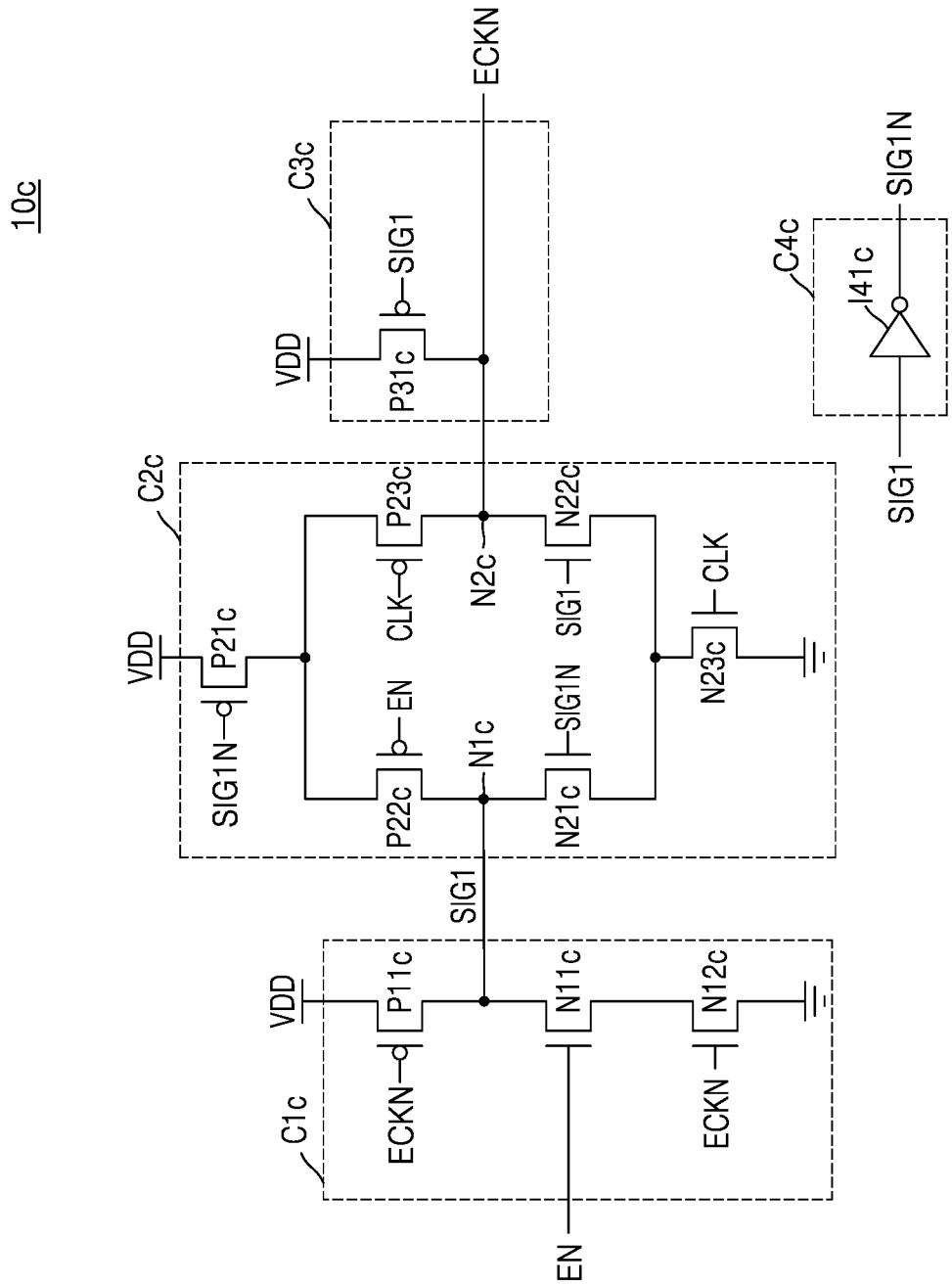
Figure 9:
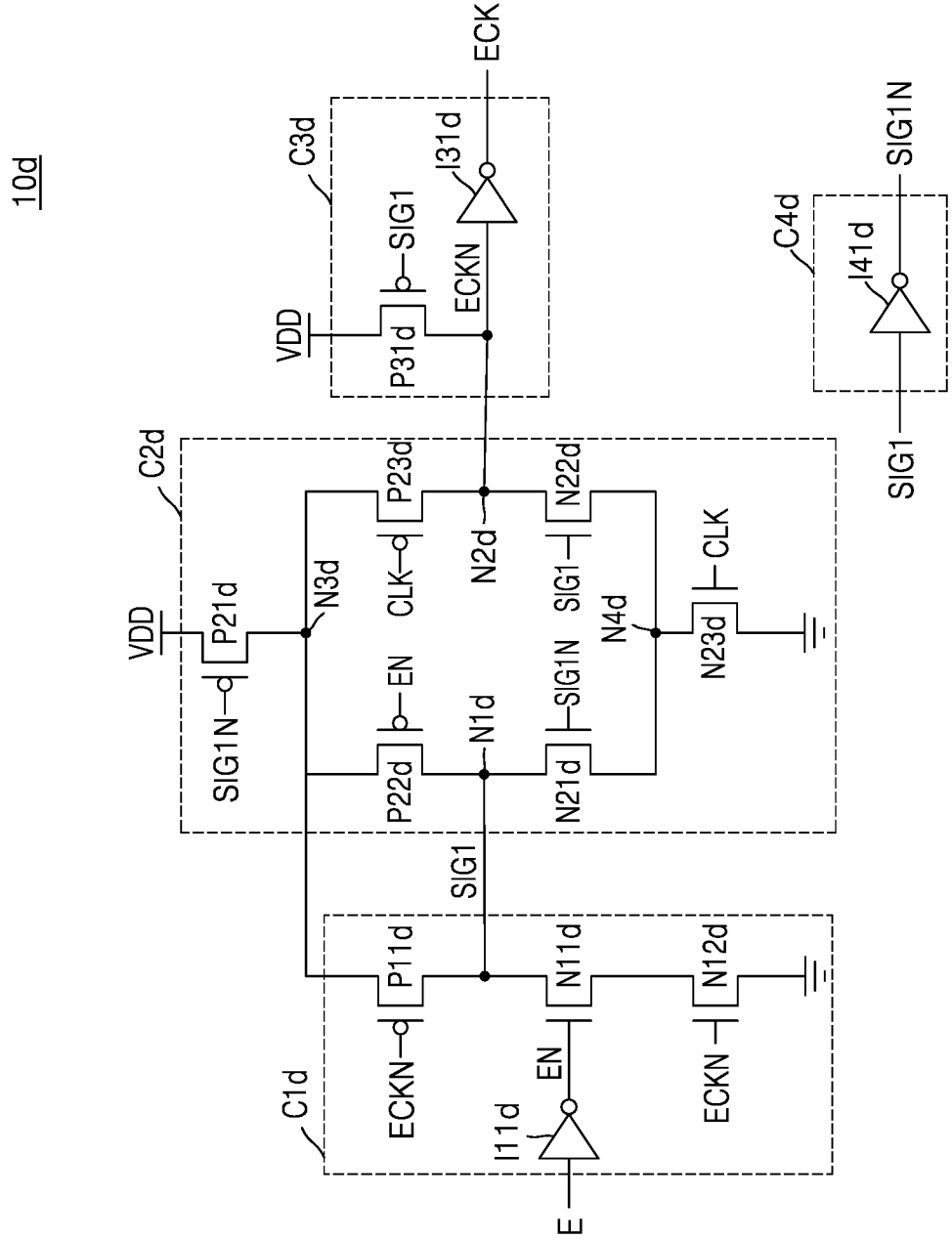

In addition, signals according to the lapse of time in clock gating cells 10b, 10c, and 10d of FIGS. 7 to 9 may be similar to those described above with reference to the timing diagram of FIG. 6. In addition, in FIGS. 7 to 11B, elements which correspond to those shown in FIG. 4 will be denoted by "b", "c", "d", "e", "f" and "g", respectively. For example, the first PFET transistor P11b of FIG. 7 may correspond to the first PFET transistor P11a of FIG. 4.

Referring to FIG. 7, first, second, third and fourth blocks C1b, C2b, C3b and C4b may be similar to the first to fourth blocks C1a to C4a of FIG. 4, respectively. In an example embodiment of the inventive concept, some of the transistors receiving the first signal SIG1 may receive delayed first signals SIG1D through a buffer, instead of the first signal SIG1.

In an example embodiment of the inventive concept, the fourth block C4b may include first and second inverters I41b and I42b to generate the delayed first signals SIG1D. The first inverter I41b may generate the inverted first signal SIG1N by inverting the first signal SIG1, and the second inverter I42b may generate the delayed first signal SIG1D by inverting the inverted first signal SIG1N.

At least one of a fourth NFET transistor N22b of the second block C2b and a sixth PFET transistor P31b of the third block C3b may receive the delayed first signal SIG ID instead of the first signal SIG1.

Although FIG. 7 shows that both the fourth NFET transistor N22b and the sixth PFET transistor P31b receive the delayed first signal SIG1D, the inventive concept is not limited thereto, and the fourth NFET transistor N22b may receive the first signal SIG1 and the sixth PFET transistor P31b may receive the delayed first signal SIG1D.

Referring to FIG. 8, first, second, third and fourth blocks C1c, C2c, C3c and C4c may be similar to the first to fourth blocks C1a to C4a of FIG. 4, respectively. In an example embodiment of the inventive concept, at least one of the inverter I11a of the first block C1a and the inverter I31a of the third block C3a of FIG. 4 may be omitted.

In an example embodiment of the inventive concept, the first block C1c may directly receive the inverted enable signal EN from the outside instead of the enable signal E. In an example embodiment of the inventive concept, the third block C3c may immediately output the inverted output clock signal ECKN generated through a second node N2c.

Referring to FIG. 9, first, second, third and fourth blocks C1d, C2d, C3d, and C4d may be similar to the first to fourth blocks C1a to C4a of FIG. 4, respectively. In an example embodiment of the inventive concept, the first block C1d may be connected to the second block C2d instead of the power voltage node VDD. For example, a first PFET transistor P11d may be connected between a third node N3d of the second block C2d and a first node N1d and may be controlled by the inverted output clock signal ECKN. In other words, because the first PFET transistor P11d is connected to an internal node of a clock gating cell 10d instead of the power voltage node VDD, the load on a routing path on a layout may be reduced.

Figure 10:
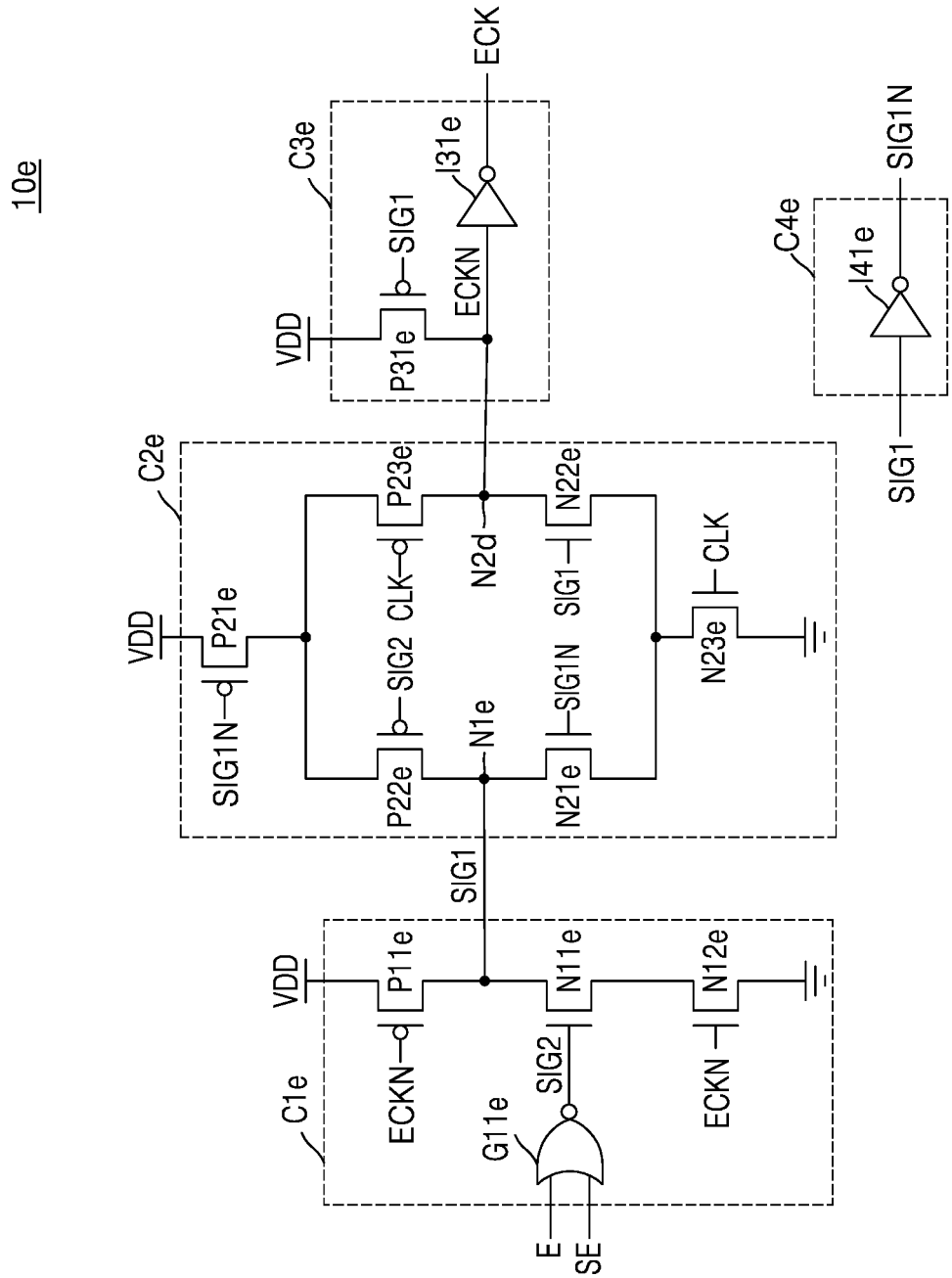

Referring to FIG. 10, first, second, third and fourth blocks C1e, C2e, C3e and C4e may be similar to the first to fourth blocks C1a to C4a of FIG. 4, respectively. In an example embodiment of the inventive concept, a clock gating cell 10e may operate in a plurality of operation modes. To accomplish this, the clock gating cell 10e may further receive a scan enable signal SE.

In an example embodiment of the inventive concept, the clock gating cell 10e may operate in a normal operation mode in which data transmission is performed according to the scan enable signal SE or a test mode in which a test operation is performed. For example, the normal operation mode may be indicated when the scan enable signal SE is at a first logic level (e.g., a logic low level) and a scan test mode may be indicated when the scan enable signal SE is at a second logic level (e.g., a logic high level).

Unlike the first block C1a of FIG. 4, the first block C1e of the clock gating cell 10e may further include a NOR gate G11e instead of the inverter I11a. The NOR gate G11e may receive the enable signal E and the scan enable signal SE and output a second signal SIG2.

The first NFET transistor N11e of the first block C1e may be connected between a first node N1e and a source of a second NFET transistor N12e and may be controlled by the second signal SIG2 applied to its gate. In addition, a fourth PFET transistor P22e of the second block C2e may be controlled by the second signal SIG2 instead of the inverted enable signal EN.

Although the embodiments of FIG. 7 to 10 have been described in order, at least two of the embodiments may be duplicated and combined with each other. In an example embodiment of the inventive concept, as the embodiments of FIGS. 8 and 9 are combined, the first block C1d of the clock gating cell 10d may be connected to the second block C2d instead of the power voltage node VDD, and an inverter I11d of the first block C1d and an inverter I31d of a third block C3d may be omitted.

Figure 11A:
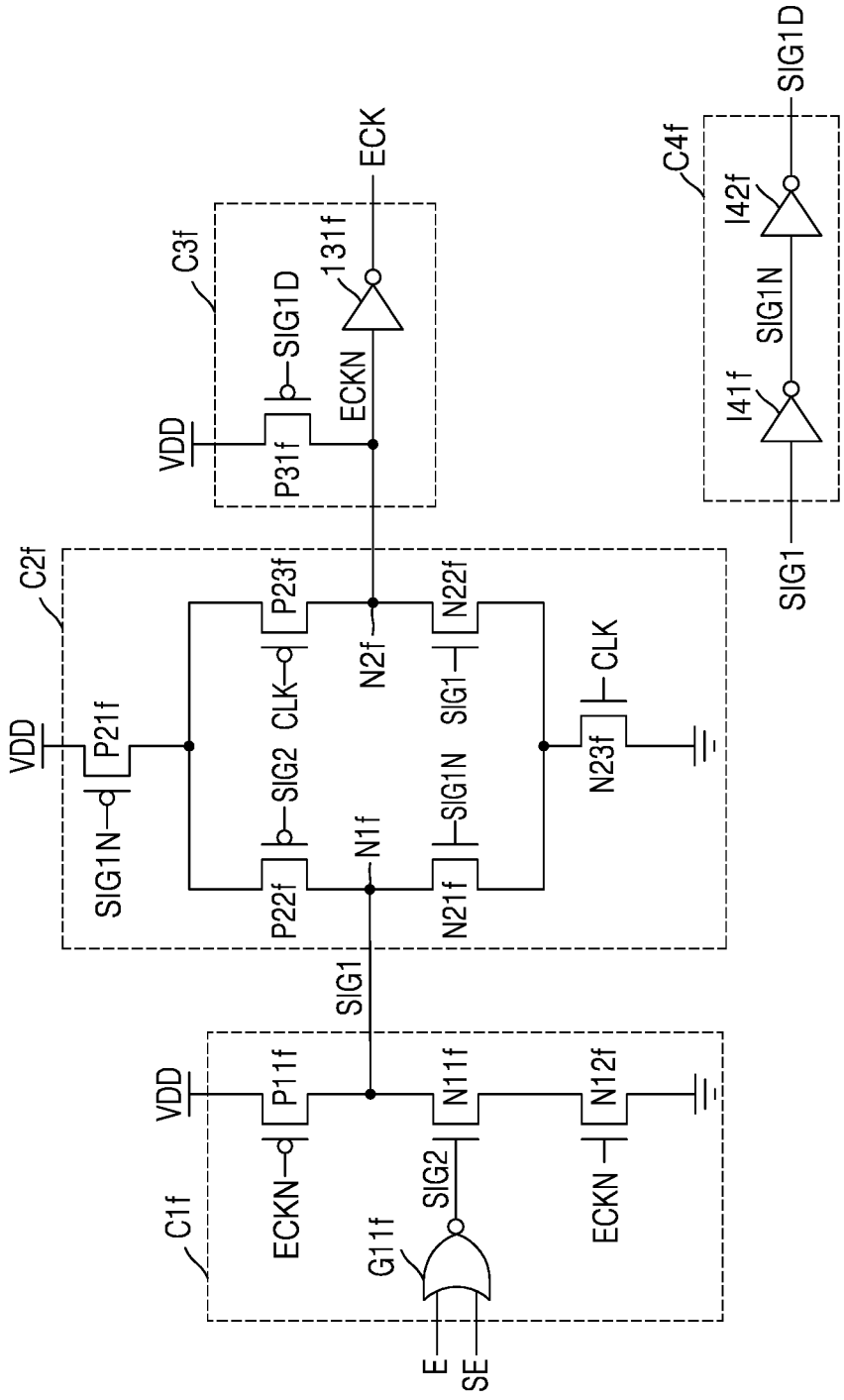

In an example embodiment of the inventive concept, the embodiments of FIGS. 7 and 10 may be combined. Referring to FIG. 11A, a first block C1f of a clock gating cell 10f may include a NOR gate G11f, thereby operating in the normal operation mode or the scan test mode. In addition, a fourth block C4f may include a first inverter I41f that generates the inverted first signal SIG1N by inverting the first signal SIG1 and a second inverter I42f may generate the delayed first signal SIG1D by inverting the inverted first signal SIG1N. Therefore, a sixth PFET transistor P31f of a third block C3f may receive the delayed first signal SIG1D through a buffer.

Figure 11B:
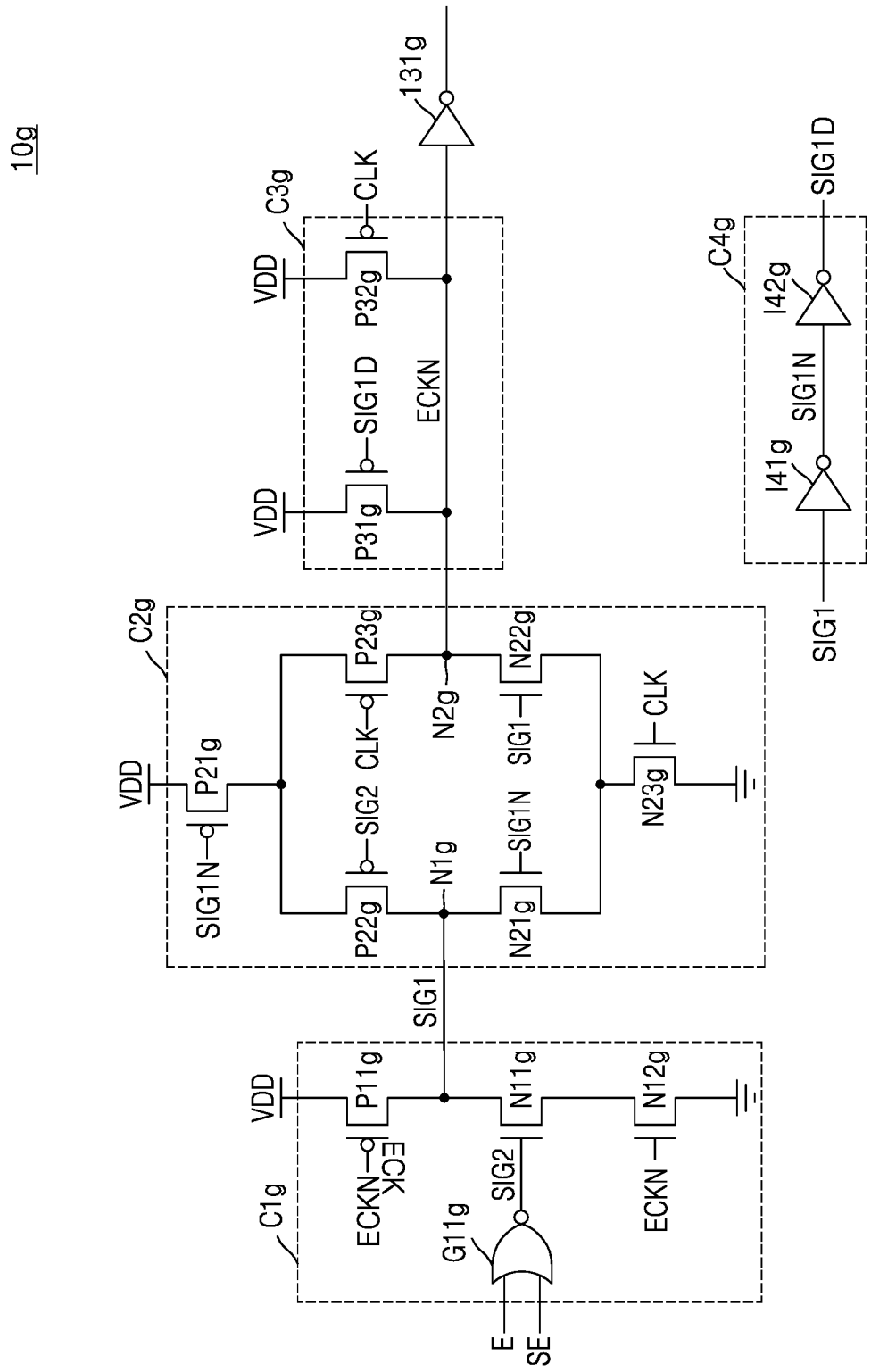

In an example embodiment of the inventive concept, referring to FIG. 11B, a third block C3g of a clock gating cell 10g may further include a seventh PFET transistor P32g as compared to the third block C3f of the clock gating cell 10f. The seventh PFET transistor P32g may be connected between a second node N2g and the power voltage node VDD and may be controlled by the clock input CLK applied to its gate. In an example embodiment of the inventive concept, the number of the seventh PFET transistor P32g may be one or greater, wherein the number of the seventh PFET transistor P32g may correspond to the number of fourth NFET transistors N22g and the number of fifth NFET transistors N23g. In addition, the seventh PFET transistor P32g may also be added to the third block C3b of FIG. 7, the third block C3d of FIG. 9, and the third block C3e of FIG. 10.

The clock gating cell 10g may drive a load cell by outputting the clock output ECK to the load cell. In this case, when the parasitic capacitance of the load cell is large, the numbers of the fourth NFET transistors N22g, the fifth NFET transistors N23g, and inverters I31g connected to the second node N2g may be increased, thereby increasing the intensity of the inverted clock output ECKN and reducing the rising time of the inverted clock output ECKN.

Figure 12:
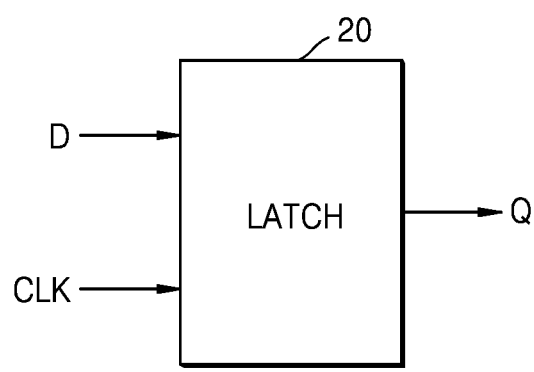
FIG. 12 is a diagram showing a logic symbol of a latch circuit according to an example embodiment of the inventive concept.

According to an example embodiment of the inventive concept, since the seventh PFET transistor P32g is added, the inverted clock output ECKN may be balanced in correspondence to the number of the fourth NFET transistors N22g and the number of the fifth NFET transistors N23g. Therefore, the overall power consumption and/or a sacrifice in the operating speed may be minimized and the clock output ECK may be supplied stably. FIG. 12 is a diagram showing a logic symbol of a latch circuit according to an example embodiment of the inventive concept, and FIG. 13 is a block diagram of a latch circuit according to an example embodiment of the inventive concept.

Figure 13:
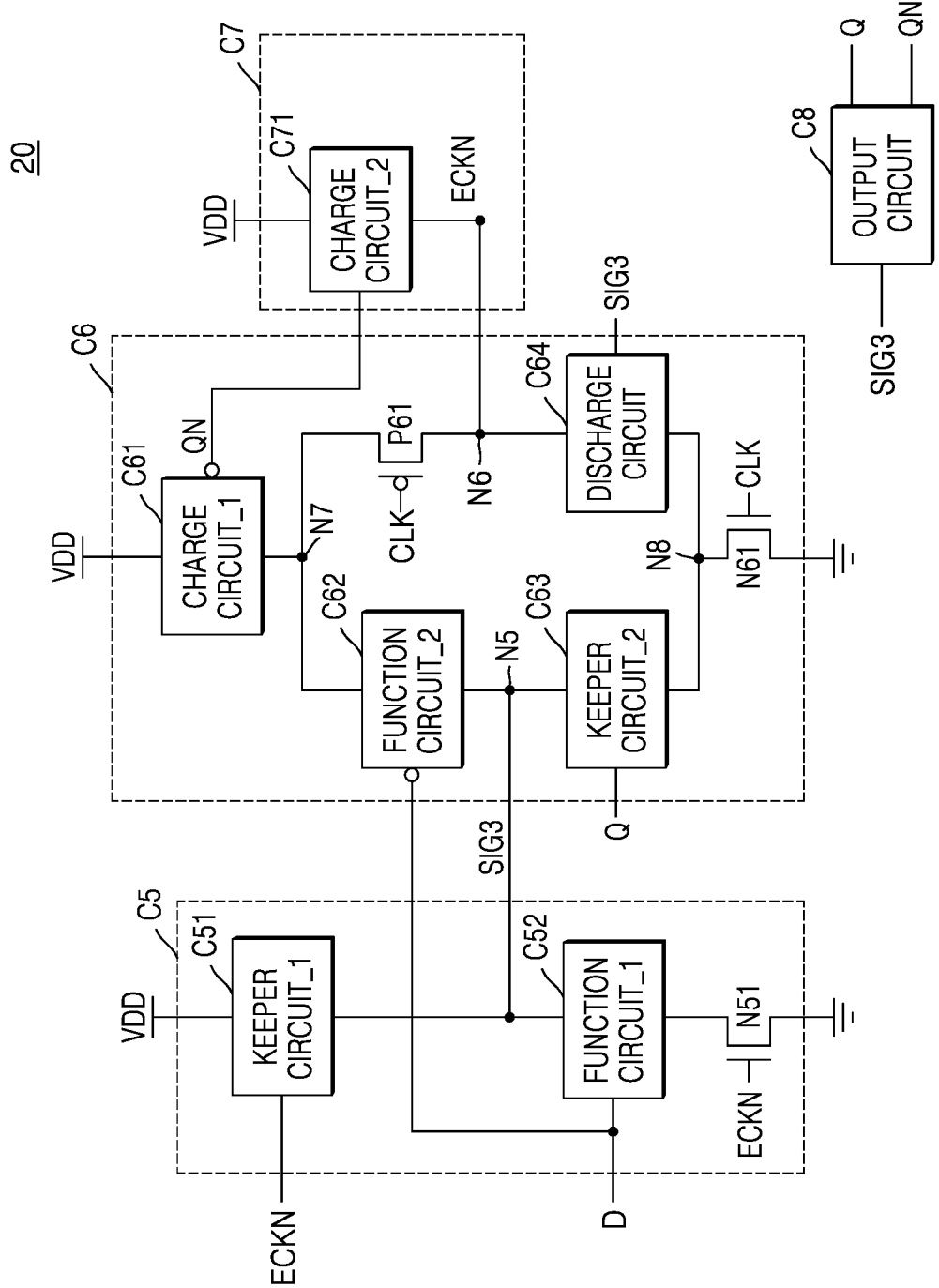
FIG. 13 is a block diagram showing a latch circuit according to an embodiment of the inventive concept.

FIG. 12 is a diagram showing a logic symbol of a latch circuit according to an example embodiment of the inventive concept, and FIG. 13 is a block diagram of a latch circuit according to an example embodiment of the inventive concept.

Referring to FIG. 12, a latch circuit 20 may generate an output signal Q based on a data signal D in response to the input clock signal CLK. For example, the latch circuit 20 may be triggered in response to a negative edge or a positive edge of the input clock signal CLK.

FIG. 13 may be a block diagram of the latch circuit 20 as an embodiment of FIG. 12.

The latch circuit 20 may include fifth, sixth, seventh and eighth blocks C5, C6, C7 and C8. The fifth to eighth blocks C5 to C8 may be similar to the first to fourth blocks C1 to C4 of FIG. 2, respectively. Therefore, descriptions identical to those already given above will be omitted below. As described later with reference to FIGS. 14 and 15, first and second keeper circuits CSI and C63, first and second function circuits C52 and C62, first and second charge circuits C61 and C71, a discharge circuit C64, and an output circuit C8 may each include at least one transistor.

The fifth block C5 may receive the inverted output clock signal ECKN and the data signal D and may be connected to the power voltage node VDD, a fifth node N5, and the ground node. The fifth block C5 may include the first keeper circuit C51, the first function circuit C52, and a fourth transistor N51.

The first keeper circuit C51 may be similar to the first keeper circuit C1 of FIG. 3A, and the fourth transistor N51 may be similar to the first transistor N11 of FIG. 3A.

The first function circuit C52 may receive the data signal D and may be connected to the fifth node N5 and a source of the fourth transistor N51. A third signal SIG3 may be generated by the fifth node N5.

The sixth block C6 may receive the data signal D, the output signal Q, the input clock signal CLK, and an inverted output signal QN and may be connected to the power voltage node VDD, the fifth node N5, a sixth node N6, and the ground node. The sixth block C6 may include the second function circuit C62, the second keeper circuit C63, the first charge circuit C61, fifth and sixth transistors P61 and N61, and the discharge circuit C64.

The second function circuit C62 may receive the data signal D and may be connected to the fifth node N5 and a seventh node N7. In addition, in FIG. 13, the circle shown at the second function circuit C62 may denote an inverter. Therefore, the second function circuit C62 may use an inverted data signal DN. In addition, polarities of respective signals for controlling the first function circuit C52 and the second function circuit C62 may be opposite to each other.

The second keeper circuit C63 may receive the output signal Q and may be connected to the fifth node N5 and an eighth node N8.

The first charge circuit C61 may receive the inverted output signal QN and may be connected to the power voltage node VDD and the seventh node N7. The circle shown at the first charge circuit C61 may denote an inverter. Therefore, the first charge circuit C61 may use the output signal Q.

The fifth transistor P61 may receive the input clock signal CLK and may be connected to the sixth node N6 and the seventh node N7. For example, the fifth transistor P61 may be connected between the sixth node N6 and the seventh node N7 and may be controlled by the input clock signal CLK applied to its gate. The inverted output clock signal ECKN may be generated by the sixth node N6.

The sixth transistor N61 may receive the input clock signal CLK and may be connected to the eighth node N8 and the ground node. For example, the sixth transistor N61 may be connected between the eighth node N8 and the ground node and may be controlled by the input clock signal CLK.

The discharge circuit C64 may receive the third signal SIG3 and may be connected to the sixth node N6 and the eighth node N8.

The seventh block C7 may include the second charge circuit C71. The second charge circuit C71 may receive the inverted output signal QN from the first charge circuit C61 and may be connected to the power voltage node VDD and the sixth node N6.

The eighth block C8 may receive the third signal SIG3 and may generate the output signal Q and/or the inverted output signal QN.

Similar to that described above, the first charge circuit C61 and the second charge circuit (C71 may determine the logic level of the third signal SIG3 and the logic level of the inverted output clock signal ECKN under the control of the fifth transistor P61.

For example, when the logic level of the input clock signal CLK is a logic low level, the fifth transistor P61 may be turned on by the input clock signal CLK and the first charge circuit C61 may determine the logic level of the inverted output clock signal ECKN of the sixth node N6.

For example, when the logic level of the input clock signal CLK is a logic high level, the fifth transistor P61 may be turned off by the input clock signal CLK and the first charge circuit C61 is unable to determine the logic level of the inverted output clock signal ECKN of the sixth node N6. In this case, the second charge circuit C71 may determine the logic level of the inverted output clock signal ECKN of the sixth node N6.

For example, when the logic level of the input clock signal CLK is a logic low level, the fifth transistor P61 may be turned on by the input clock signal CLK. In this case, based on the ON/OFF state of the second function circuit C62, the second charge circuit C71 may determine the logic level of the third signal SIG3 of the fifth node N5.

Because the latch circuit 20 according to the present embodiment includes only one pair of transistors receiving the input clock signal CLK, a low power latch circuit of which power consumption due to the input clock signal CLK is reduced may be implemented.

Figure 14:
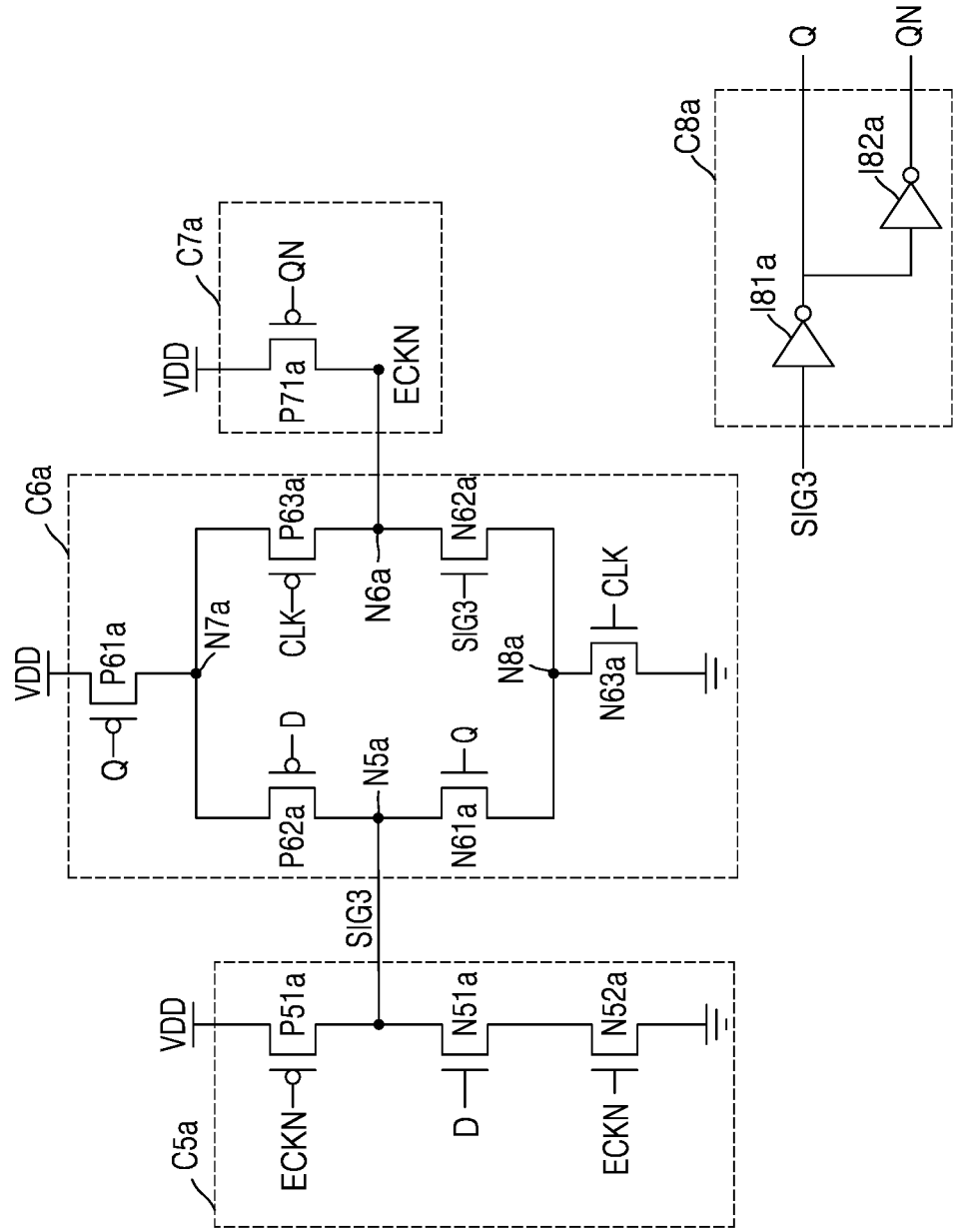
FIGS. 14 and 15 are circuit diagrams of latch circuits according to example embodiments of the inventive concept.
Figure 15:
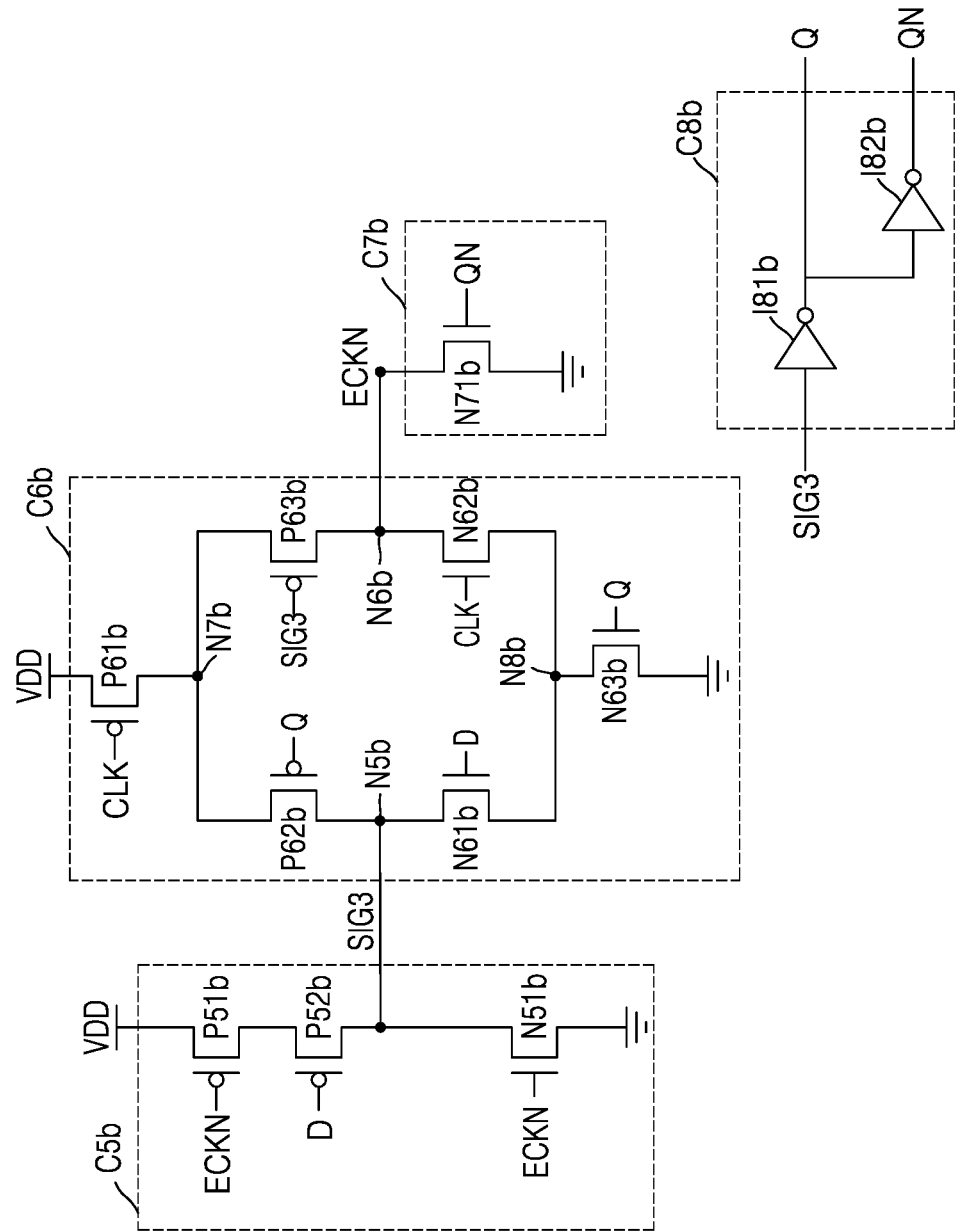

FIGS. 14 and 15 are circuit diagrams of latch circuits according to example embodiments of the inventive concept.

Referring to FIG. 14, as an embodiment of FIG. 13, a latch circuit 20a may operate in response to a negative edge of the input clock signal CLK input thereto. In other words, the latch circuit 20a may be a negative edge-triggered latch circuit.

A fifth block C5a may receive the data signal D and the inverted output clock signal ECKN and may be connected to a fifth node N5a. The third signal SIG3 may be generated by the fifth node N5a.

The fifth block C5a may include a seventh PFET transistor P51a and sixth and seventh NFET transistors N51a and N52a.

The seventh PFET transistor P51a may be connected between the power voltage node VDD and the fifth node N5a and may be controlled by the inverted output clock signal ECKN. The sixth and seventh NFET transistors N51a and N52a may be connected in series between the fifth node N5a and the ground node and may be controlled by the data signal D and the inverted output clock signal ECKN, respectively.

A sixth block C6a may receive the output signal Q, the data signal D, the third signal SIG3, and the input clock signal CLK and may be connected to a sixth node N6a. The inverted output clock signal ECKN may be generated by the sixth node N6a.

The sixth block C6a may include eighth, ninth and tenth PFET transistors P61a, P62a, and P63a and eighth, ninth and tenth NFET transistors N61a, N62a, and N63a.

The eighth PFET transistor P61a may be connected between the power voltage node VDD and a seventh node N7a and may be controlled by the output signal Q. The ninth PFET transistor P62a may be connected between the seventh node N7a and the fifth node N5a and may be controlled by the data signal D. The tenth PFET transistor P63a may be connected between the seventh node N7a and the sixth node N6a and may be controlled by the input clock signal CLK.

The eighth NFET transistor N61a may be connected between the fifth node N5a and an eighth node N8a and may be controlled by the output signal Q. The ninth NFET transistor N62a may be connected between the sixth node N6a and the eighth node N8a and may be controlled by the third signal SIG3. The tenth NFET transistor N63a may be connected between the eighth node N8a and the ground node and may be controlled by the input clock signal CLK.

A seventh block C7a may be connected to the power voltage node VDD and the sixth node N6a. In an example embodiment of the inventive concept, the seventh block C7a may include an eleventh PFET transistor P71a that is connected between the power voltage node VDD and the sixth node N6a and is controlled by the inverted output signal QN.

In an example embodiment of the inventive concept, an eighth block C8a may include an inverter I81a that generates the output signal Q by inverting the third signal SIG3 and an inverter I82a that generates the inverted output signal QN by inverting the output signal Q.

Referring to FIG. 15, as an embodiment of FIG. 13, a latch circuit 20b may operate in response to a positive edge of the input clock signal CLK input thereto. In other words, the latch circuit 20b may be a positive edge-triggered latch circuit.

Because fifth, sixth, seventh and eighth blocks C5b, C6b, C7b and C8b of the latch circuit 20b may be similar to the fifth to eighth blocks C5a to C8a of FIG. 13, respectively, descriptions identical to those already given above may be omitted below. In FIG. 15, elements which correspond to those shown in FIG. 14 will be denoted by "b".

The fifth block C5b may include twelfth and thirteenth PFET transistors P51b and P52b and an eleventh NFET transistor N51b. The twelfth and thirteenth PFET transistors P51b and P52b may be connected in series between the power voltage node VDD and a fifth node N5b and may be controlled by the inverted output clock signal ECKN and the data signal D, respectively. The eleventh NFET transistor N51b may be connected between the fifth node N5b and the ground node and may be controlled by the inverted output clock signal ECKN.

The sixth block C6b may include fourteenth, fifteenth and sixteenth PFET transistors P61b, P62b, and P63b and twelfth, thirteenth and fourteenth NFET transistors N61b, N62b, and N63b.

The fourteenth PFET transistor P61b may be connected between the power voltage node VDD and a seventh node N7b and may be controlled by the input clock signal CLK. The fifteenth PFET transistor P62b may be connected between the fifth node N5b and the seventh node N7b and may be controlled by the output signal Q. The sixteenth PFET transistor P63b may be connected between a sixth node N6b and the seventh node N7b and may be controlled by the third signal SIG3.

The twelfth NFET transistor N61b may be connected between the fifth node N5b and an eighth node N8b and may be controlled by the data signal D. The thirteenth NFET transistor N62b may be connected between the sixth node N6b and the eighth node N8b and may be controlled by the input clock signal CLK. The fourteenth NFET transistor N63b may be connected between the eighth node N8b and the ground node and may be controlled by the output signal Q.

A seventh block C7b may be connected to the ground node and the sixth node N6b. In an example embodiment of the inventive concept, the seventh block C7b may further include a fifteenth NFET transistor N71b that is connected between the ground node and the sixth node N6b and is controlled by the inverted output signal QN.

An eighth block C8b may be similar to the eighth block C8a of FIG. 14.

The fifth to seventh blocks C5a to C7a of FIG. 14 may be divided into a pull-up unit and a pull-down unit based on the fifth node N5a and the sixth node N6a. In the same regard, the fifth to seventh blocks C5b to C7b of FIG. 15 may be divided into a pull-up unit and a pull-down unit based on the fifth node N5b and the sixth node N6b.

For example, referring to FIG. 14, the seventh PFET transistor P51a of the fifth block C5a may be classified as a pull-up unit, whereas the sixth and seventh NFET transistors N51a and N52a may be classified as a pull-down unit. In the sixth block C6a, the eighth to tenth PFET transistors P61a, P62a, and P63a may be classified as a pull-up unit, whereas the eighth to tenth NFET transistors N61a, N62a, and N63a may be classified as a pull-down unit. The eleventh PFET transistor P71a of the seventh block C7a may be classified as a pull-up unit.

Referring to FIG. 15, the twelfth and thirteenth PFET transistors P51b and P52b of the fifth block C5b may be classified as a pull-up unit, whereas the eleventh NFET transistor N51b may be classified as a pull-down unit. In the sixth block C6b, the fourteenth to sixteenth PFET transistors P61b, P62b, and P63b may be classified as a pull-up unit, whereas the twelfth to fourteenth NFET transistors N61b, N62b, and N63b may be classified as a pull-down unit. The fifteenth NFET transistor N71b of the seventh block C7b may be classified as a pull-down unit.

By being divided into a pull-up unit and a pull-down unit, the negative edge-triggered latch circuit 20a and the positive edge-triggered latch circuit 20b may have structures symmetrical around the fifth nodes N5a and N5b and the sixth nodes N6a and N6b. In addition, pull-up units of the latch circuits 20a and 20b may be implemented by PFET transistors, whereas pull-down units may be implemented by NFET transistors.

Figure 16A:
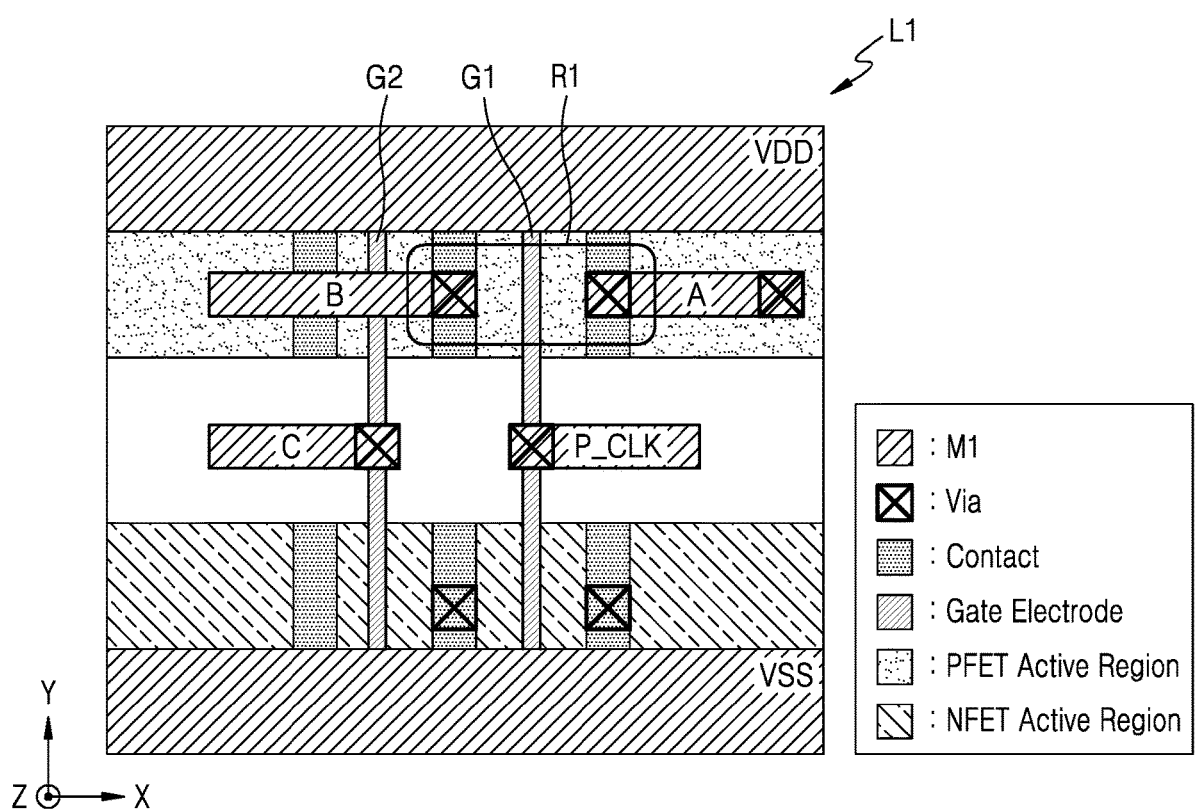
FIGS. 16A and 16B are diagrams schematically showing partial layouts of a clock gating cell and a latch circuit according to example embodiments of the inventive concept.
Figure 16B:
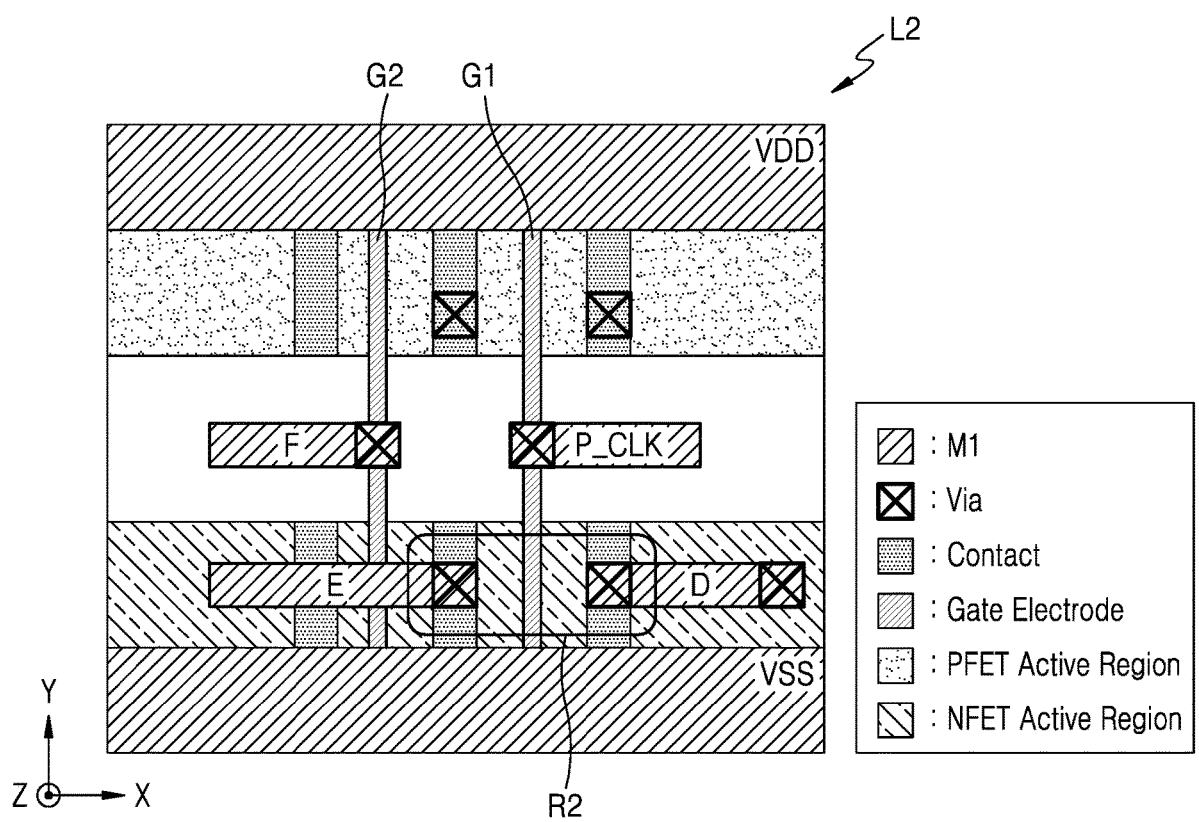

FIGS. 16A and 16B are diagrams schematically showing partial layouts of a clock gating cell and a latch circuit according to example embodiments of the inventive concept. For example, FIG. 16A may be a diagram schematically showing a layout corresponding to the second block C2a of the clock gating cell 10a of FIG. 4, and more particularly, the fifth PFET transistor P23a included in the second block C2a and a surrounding region thereof. For example, FIG. 16B may be a diagram schematically showing a layout corresponding to the sixth block C6b of the clock gating cell 20b of FIG. 15, and more particularly, the thirteenth NFET transistor N62b included in the sixth block C6b and a surrounding region thereof. However, the inventive concept is not limited thereto, and FIG. 16B may correspond to second blocks C2b, C2c, C2d, C2e, and C2f of clock gating cells 10b, 10c, 10d, 10e, and 10f of FIGS. 7 to 11B and the sixth block C6a of the latch circuit 20a of FIG. 14. A first layout L1 may be a schematic partial representation of clock gating cells 10b to 10f or the latch circuit 20a on a plane including an X-axis and a Y-axis.

In FIGS. 16A and 16B, only some layers and some patterns may be shown for convenience of illustration, and vias may be shown even though they are located under a pattern of a wiring layer to indicate connections between the pattern of the wiring layer and patterns therebelow. Further, a pattern consisting of a conductive material like a pattern of a wiring layer may be referred to as a conductive pattern or may be simply referred to as a pattern.

As shown in FIGS. 16A and 16B, at least one gate electrode may extend in the Y-axis direction. In addition, at least one active region may extend in the X-axis direction and may constitute a transistor together with a gate electrode. In some embodiments of the inventive concept, at least one fin may extend in the X-axis direction in active regions and constitute a finFET together with a gate electrode.

Descriptions will be given below with reference to FIGS. 4 and 16A together, and, for convenience of explanation, it will be assumed, but is not limited to, that the first layout L1 corresponds to the fifth PFET transistor P23a included in the second block C2a of the clock gating cell 10a (FIG. 4) and the surrounding region thereof.

A first gate electrode G1 may be connected to a clock pattern P_CLK, and the input clock signal CLK may be applied to the clock pattern P_CLK. In a first region R1 of a PFET active region, a first pattern A, a second pattern B, and the first gate electrode G1 may form a PFET transistor. The PFET transistor may correspond to the fifth PFET transistor P23a of the clock gating cell 10a.

The first pattern A may be connected to a source or a drain of the fifth PFET transistor P23a. For example, the first pattern A may correspond to the second node N2a and the inverted output clock signal ECKN may be applied thereto. The first pattern A may be connected to an output inverter. The second pattern B may be connected to the source or the drain of the fifth PFET transistor P23a and, for example, may correspond to the third node N3a.

According to example embodiments of the inventive concept, because the clock gating cell 10a includes only one PFET transistor and one NFET transistor for receiving the input clock signal CLK, signals other than the input clock signal CLK may be applied to a third pattern C connected to a second gate electrode G2. For example, the inverted first signal SIG1N provided to a gate of the third PFET transistor P21a or the inverted enable signal EN provided to a gate of the fourth PFET transistor P22a may be applied to the third pattern C.

Transistors other than transistors receiving the input clock signal CLK, e.g., the third and fourth PFET transistors P21a and P22a adjacent to the fifth PFET transistor P23a, may not be electrically connected to the clock pattern P_CLK.

In addition, the first gate electrode G1 may form an NFET transistor in an NFET active region. Therefore, the first layout L1 may include two transistors receiving the input clock signal CLK due to the first gate electrode G1. Here, a source and a drain of at least one of the two transistors may be connected to nodes other than the power voltage node VDD and the ground node. For example, a source of a PFET transistor formed in the first region R1 may be connected to the third node N3a and a drain of the PFET transistor may be connected to the second node N2a.

Referring to FIG. 16B, a second layout L2 may be a schematic layout corresponding to the sixth block C6b of the clock gating cell 20b of FIG. 15, and more particularly, the thirteenth NFET transistor N62b included in the sixth block C6b and a surrounding region thereof. The second layout L2 may be a schematic representation of a portion of the latch circuit 20b on a plane including an X-axis and a Y-axis.

Descriptions will be given below with reference to FIGS. 15 and 16B together, and, for convenience of explanation, it will be assumed, but is not limited to, that the second layout L2 corresponds to the thirteenth NFET transistor N62b included in the sixth block C6b of the latch circuit 20b (FIG. 15) and the surrounding region thereof. In addition, descriptions identical to those already given above with reference to FIG. 16A may be omitted below.

A first gate electrode G1 may be connected to a clock pattern P_CLK, and the input clock signal CLK may be applied to the clock pattern P_CLK. In a second region R2 of an NFET active region, the first gate electrode G1 may form an NFET transistor. The NFET transistor may correspond to the thirteenth NFET transistor N62b of the latch circuit 20b. A fourth pattern D may be connected to a source or a drain of the thirteenth NFET transistor N62b. For example, the fourth pattern D may correspond to the sixth node N6b and the inverted output clock signal ECKN may be applied thereto. A fifth pattern E may be connected to the source and the drain of the thirteenth NFET transistor N62b and, for example, may correspond to the eighth node N8b.

According to example embodiments of the inventive concept, because the latch circuit 20b includes only one PFET transistor and one NFET transistor for receiving the input clock signal CLK, signals other than the input clock signal CLK may be applied to a sixth pattern F connected to a second gate electrode G2. For example, the output signal Q provided to a gate of the fifteenth PFET transistor P62b and a gate of the fourteenth NFET transistor N63b may be applied to the sixth pattern F.

Transistors other than transistors receiving the input clock signal CLK, e.g., the fourteenth and fifteenth NFET transistors N63b and N71b adjacent to the thirteenth NFET transistor N62b, may not be electrically connected to the clock pattern P_CLK.

In addition, the first gate electrode G1 may form a PFET transistor in a PFET active region. Therefore, the second layout L2 may include two transistors receiving the input clock signal CLK due to the first gate electrode G1. Here, a source and a drain of at least one of the two transistors may be connected to nodes other than the power voltage node VDD and the ground node. For example, a source of an NFET transistor formed in the second region R2 may be connected to the sixth node N6b and a drain of the NFET transistor may be connected to the eighth node N8b.

Figure 17:
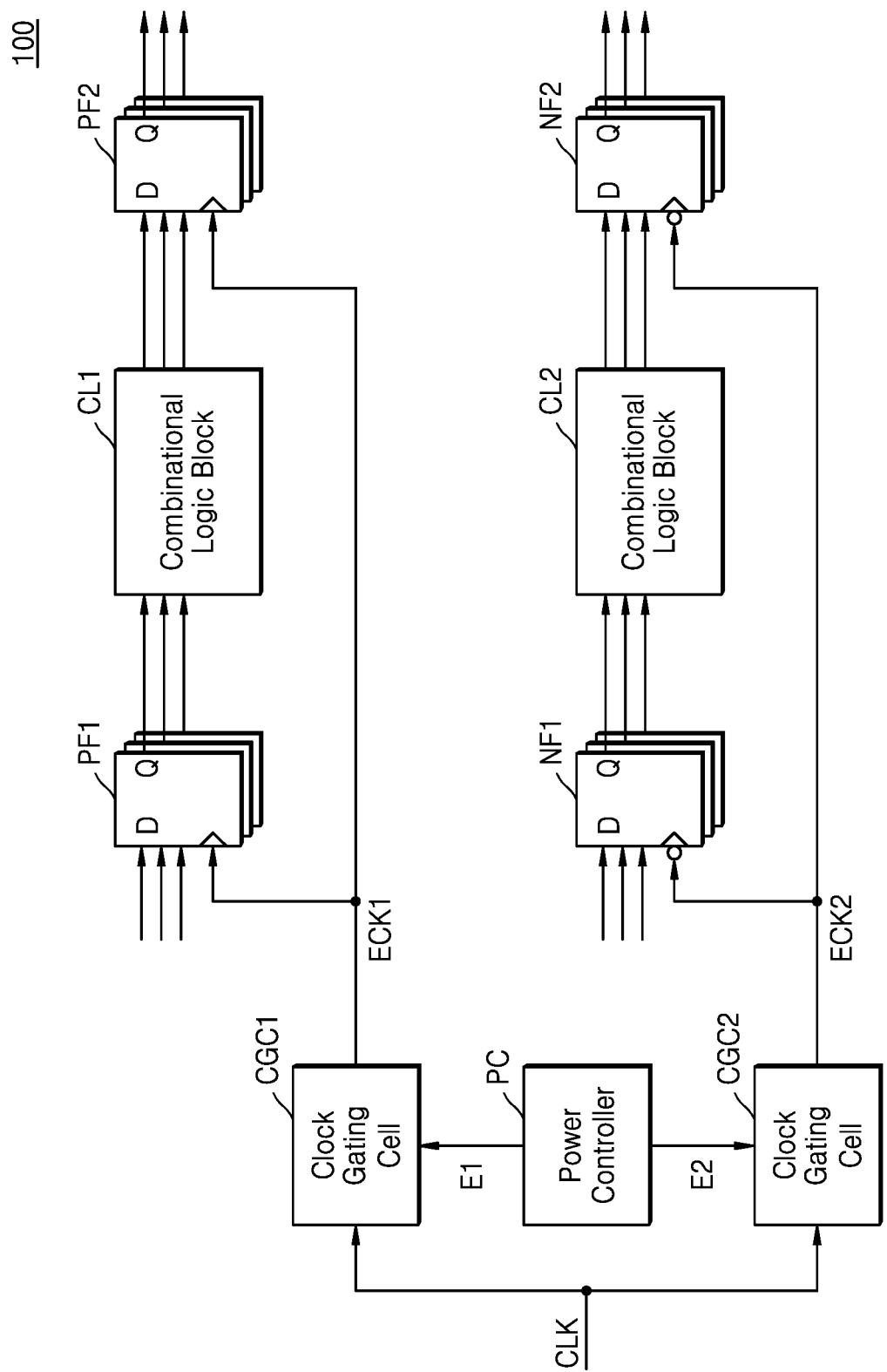
FIG. 17 is a diagram showing an IC including a clock gating cell according to an embodiment of the inventive concept.

FIG. 17 is a diagram showing an IC including a clock gating cell according to an example embodiment of the inventive concept.

Referring to FIG. 17, an IC 100 processing digital signals may include a first clock gating cell CGC1, a second clock gating cell CGC2, a power controller PC, a first combinational logic block CL1, a second combinational logic block CL2, and a plurality of flip-flops PF1, PF2, NF1, and NF2. The IC 100 may include a clock gating cell described above with reference to FIGS. 1 to 11.

The power controller PC may control the power of the IC 100 and may generate a first enable signal E1 and a second enable signal E2. For example, the power controller PC may generate an inactive first enable signal E1 to reduce power consumption by a digital circuit including at least one first positive edge triggered flip-flop PF1, the first combinational logic block CL1, and at least one second positive edge triggered flip-flop PF2. In addition, the power controller PC may generate an inactive second enable signal E2 to reduce power consumption by a digital circuit including at least one first negative edge triggered flip-flop NF1, the second combinational logic block CL2, and at least one second negative edge triggered flip-flop NF2.

The first clock gating cell CGC1 may receive an input clock signal CLK and may stop or resume the supply of a first output clock signal ECK1 based on the first enable signal E1. For example, as described above with reference to FIG. 1, the first clock gating cell CGC1 may generate the first output clock signal ECK1 that is maintained at logic '0' in a disabled state. Therefore, the first output clock signal ECK1 may be supplied to a positive edge-triggered flip-flop, for example, at least one first positive edge-triggered flip-flop PF1 and at least one second positive edge-triggered flip-flop PF2. In addition, the second clock gating cell CGC2 may receive the input clock signal CLK and may stop or resume the supply of a second output clock signal ECK2 based on the second enable signal E2. For example, as described above with reference to FIG. 1, the second clock gating cell CGC2 may generate the second output clock signal ECK2 that is maintained at logic '1' in the disabled state. Therefore, the second output clock signal ECK2 may be supplied to a negative edge-triggered flip-flop, for example, at least one first negative edge-triggered flip-flop NF1 and at least one second negative edge-triggered flip-flop NF2.

Figure 18:
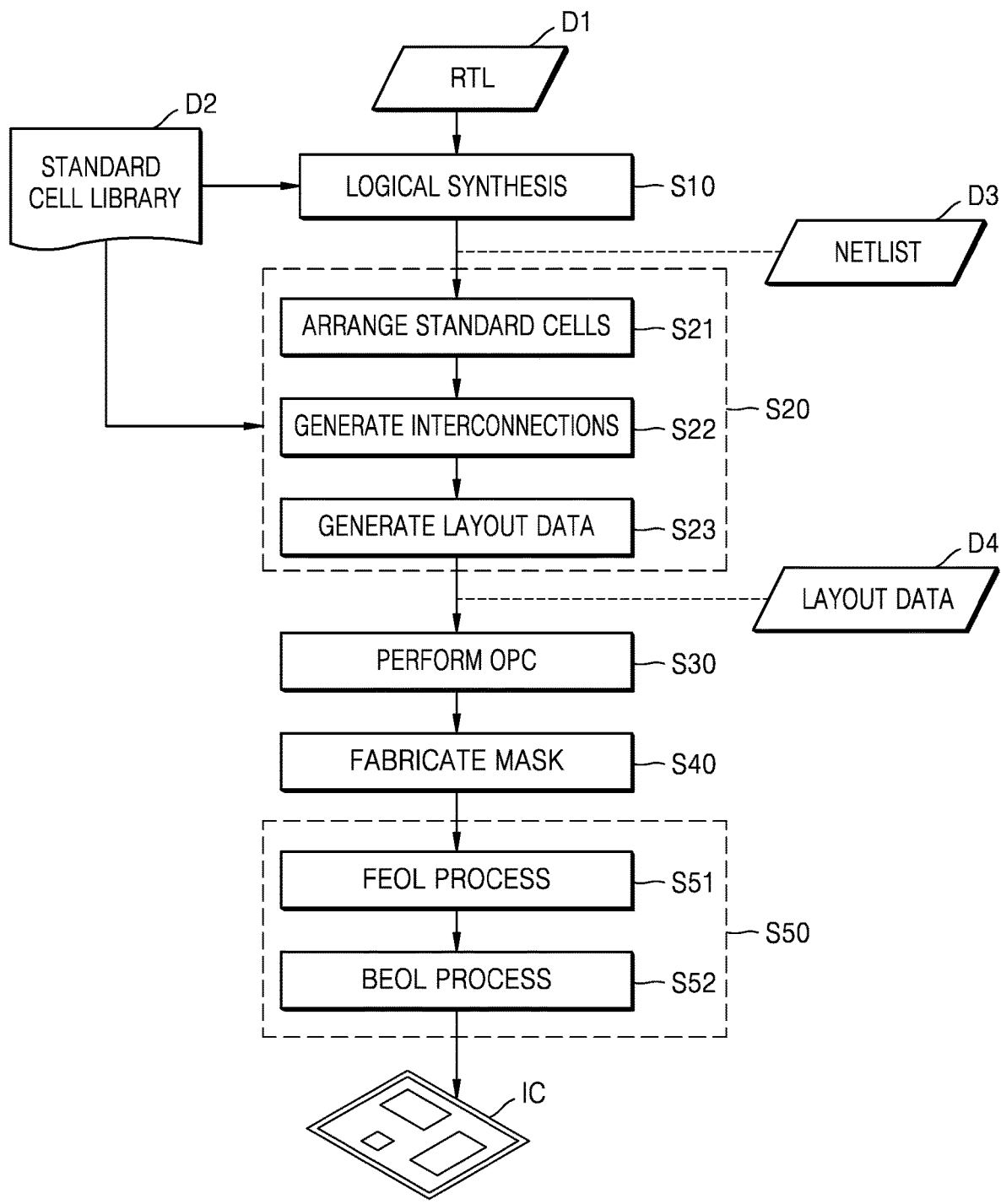
FIG. 18 is a flowchart of a method of manufacturing an IC, according to an example embodiment of the inventive concept.

FIG. 18 is a flowchart of a method of manufacturing an IC according to an example embodiment of the inventive concept.

Referring to FIG. 18, an IC (e.g., 100 of FIG. 17) including a clock gating cell as described above may be manufactured.

In some embodiments of the inventive concept, a clock gating cell may be a standard cell. A standard cell is a unit of a layout included in the integrated circuit IC and may be simply referred to as a cell. The integrated circuit IC may include a plurality of different standard cells, each of which may provide a unique function. The standard cells may have a structure complying with pre-set rules based on a semiconductor process for manufacturing the integrated circuit IC. For example, the standard cells may have a certain length or a multiple of the certain length on a plane perpendicular to a direction in which layers are stacked.

A standard cell library (or cell library) D2 may include information regarding standard cells, e.g., function information, characteristic information, layout information, etc., and may include information regarding a clock gating cell. As described above with reference to the drawings, a clock gating cell defined by the standard cell library D2 may not only provide high operational reliability, but also provide high efficiency, e.g., reduced area and low power consumption.

In operation S10, a logical synthesis operation for generating a netlist D3 from RTL data D1 may be performed. For example, a semiconductor design tool (e.g., a logical synthesis tool) may perform a logical synthesis with reference to the standard cell library D2 from the RTL data D1 composed in Very High Speed Integrated Circuit (VHSIC) Hardware Description Language (VHDL) and Verilog, thereby generating the netlist D3 including a bitstream or a netlist. The standard cell library D2 may include information regarding good performance of a clock gating cell, and standard cells may be included in the integrated circuit IC with reference to such information during a logical synthesis process.

In operation S20, a Place & Routing (P&R) operation for generating layout data D4 from the netlist D3 may be performed. As shown in FIG. 18, the P&R operation S20 may include a plurality of sub-operations S21, S22, and S23. In sub-operation S21, an operation for arranging standard cells may be performed. For example, a semiconductor design tool (e.g., a P&R tool) may arrange a plurality of standard cells with reference to the standard cell library D2 from the netlist D3. For example, the semiconductor design tool may arrange a layout of clock gating cells defined by the netlist D3 with reference to the standard cell library D2. In sub-operation S22, an operation for generating interconnections may be performed. The interconnections may electrically connect output pins to input pins of standard cells and may include, for example, at least one via and at least one conductive pattern. In sub-operation S23, an operation for generating the layout data D4 may be performed. The layout data D4 may have a format, e.g., GDSII, and may include geometric information regarding the standard cells and the interconnections.

In operation S30, an Optical Proximity Correction (OPC) may be performed. An OPC may refer to an operation for forming a pattern of a desired shape by correcting distortion such as refraction caused by light characteristics in photolithography included in a semiconductor process for manufacturing the integrated circuit IC, and the pattern on a mask may be determined by applying the OPC to the layout data D4. In some embodiments of the inventive concept, the layout of the integrated circuit IC may be limitedly modified in operation S30, and the limited modification of the integrated circuit IC in operation S30 is a post-processing for optimizing the structure of the integrated circuit IC and may be referred to as design polishing.

In operation S40, an operation for manufacturing a mask may be performed. For example, as the OPC is applied to the layout data D4, patterns on a mask may be defined to form patterns to be formed on a plurality of layers, and at least one mask (or a photomask) for forming respective patterns of the plurality of layers may be fabricated.

In operation S50, an operation for manufacturing the integrated circuit IC may be performed. For example, the integrated circuit IC may be manufactured by patterning the plurality of layers by using the at least one mask fabricated in operation S40. As shown in FIG. 18, operation S50 may include sub-operations S51 and S52. In sub-operation S51, a front-end-of-line (FEOL) process may be performed. The FEOL process may refer to a process of forming individual devices such as transistors, capacitors, and resistors on a substrate during a process of manufacturing an IC. For example, the FEOL process may include planarizing and cleaning a wafer, forming a trench, forming a well, forming a gate line, and forming a source and a drain, etc. In sub-operation S52, a back-end-of-line (BEOL) process may be performed. The BEOL process may refer to a process of interconnecting individual devices such as transistors, capacitors, and resistors during a process of manufacturing an IC. For example, the BEOL process may include silicidation of gate, source, and drain regions, adding a dielectric, planarizing, forming a hole, adding a metal layer, forming a via, forming a passivation layer, etc. Next, the IC may be packaged in a semiconductor package and used as a component for various applications. As described above, due to the low power consumption characteristics of a clock gating cell, the IC may exhibit low power consumption and high efficiency, and, as a result, the efficiency of an application including the IC may be improved.

While the inventive concept has been particularly shown and described with reference to embodiments thereof, it will be understood that various changes in form and details may be made thereto without departing from the spirit and scope of the inventive concept set forth in the following claims.

What is claimed is:

1. A clock gating cell, comprising:
   a first circuit configured to receive an enable signal and an inverted output clock signal and generate a first signal through a first node;
   a second circuit configured to receive the first signal and generate an inverted first signal;
   a third circuit configured to receive the first signal, the inverted first signal, and an input clock signal, generate the first signal by being connected to the first circuit through the first node, and generate the inverted output clock signal through a second node; and
   a fourth circuit configured to directly receive the first signal, generate the inverted output clock signal by being connected to the third circuit through the second node, and generate an output clock signal,
   wherein the third circuit comprises a pair of transistors receiving the input clock signal.

2. The clock gating cell of claim 1, wherein the third circuit comprises a first transistor and a second transistor each receiving the input clock signal,
   the first transistor is configured to control a charging path of the first node and the second node based on the input clock signal, and
   the second transistor is configured to control a discharging path of the first node and the second node based on the input clock signal.

3. The clock gating cell of claim 1, wherein the first circuit comprises:
   a first inverter configured to generate an inverted enable signal by inverting the enable signal;
   a first transistor connected between a power voltage node and the first node and receiving the inverted output clock signal; and
   a second transistor and a third transistor connected in series between the first node and a ground node,
   wherein the second transistor receives the inverted enable signal, and
   the third transistor receives the inverted output clock signal.

4. The clock gating cell of claim 1, wherein the clock gating cell is configured to further receive a scan enable signal,
   the first circuit comprises a NOR gate configured to receive the enable signal and the scan enable signal and generate a second signal.

5. The clock gating cell of claim 1, wherein the third circuit comprises:
   a first transistor connected between a power voltage node and a third node and controlled by the inverted first signal;
   a second transistor connected between the third node and the first node and controlled by the inverted enable signal;
   a third transistor connected between the second node and the first node and controlled by the input clock signal;
   a fourth transistor connected between the first node and a fourth node and controlled by the inverted first signal;
   a fifth transistor connected between the second node and the fourth node and controlled by the first signal; and
   a sixth transistor connected between a ground node and the fourth node and controlled by the input clock signal.

6. The clock gating cell of claim 5, wherein a polarity of the third transistor and a polarity of the sixth transistor are opposite to each other.

7. The clock gating cell of claim 5, the third transistor is configured to control a charging path of the first node and the second node based on the input clock signal, and
   the sixth transistor is configured to control a discharging path of the first node and the second node based on the input clock signal.

8. The clock gating cell of claim 5, wherein the second circuit generates a delayed first signal by inverting the inverted first signal, and
   the fifth transistor is applied with the delayed first signal.

9. The clock gating cell of claim 1, wherein the fourth circuit comprises:
   a first transistor connected between a power voltage and the second node and controlled by the first signal; and a first inverter configured to generate the output clock signal by inverting the inverted output clock signal.

10. The clock gating cell of claim 9, wherein the second circuit is configured to generate a delayed first signal by inverting the inverted first signal, and the first transistor is applied with the delayed first signal.

11. The clock gating cell of claim 10, wherein the fourth circuit further comprises at least one second transistor connected between the power voltage node and the second node and controlled by the input clock signal.

12. The clock gating cell of claim 11, wherein a number of the at least one second transistor corresponds to a number of a plurality of transistors, which are included in the third circuit and are connected between the second node and a ground node.

13. An integrated circuit comprising a clock gating cell that receives at least one control signal and an input clock signal and generates an output clock signal, wherein the clock gating cell comprises:
a first circuit comprising a first function circuit configured to generate a first signal through a first node based on the at least one control signal and a first keeper circuit configured to maintain a voltage level of the first signal;
a second circuit configured to receive the first signal and generate an inverted first signal;
a third circuit comprising a second function circuit configured to generate the first signal through the first node based on the at least one control signal, a second keeper circuit configured to maintain a voltage level of the first signal, a first charge circuit configured to generate an inverted output clock signal by charging a second node based on the first signal, and a discharge circuit configured to discharge the second node; and
a fourth circuit comprising a second charge circuit configured to generate the inverted output clock signal by charging the second node based on the first signal, and
the third circuit comprises a pair of transistors receiving the input clock signal,
wherein a polarity of the control signal applied to the first charge circuit and a polarity of the control signal applied to the second charge circuit are opposite to each other.

14. The integrated circuit of claim 13, wherein the first keeper circuit is input with the inverted output clock signal, the second keeper circuit is input with the inverted first signal, and the discharge circuit is input with the first signal.

15. The integrated circuit of claim 13, wherein the first charge circuit includes a p-type field effect transistor (PFET) transistor applied with the inverted first signal, and the second charge circuit includes a PFET transistor applied with the first signal.

16. The integrated circuit of claim 14, wherein the third circuit further comprises a first transistor that is input with the input clock signal and is connected to the first charge circuit and the second charge circuit, the second node is charged by the first charge circuit when the first transistor is turned on, and the second node is charged by the second charge circuit when the first transistor is turned off.

17. The integrated circuit of claim 16, wherein the third circuit further comprises a second transistor configured to control a discharging path of the first node and the second node.

18. A latch circuit, comprising:
a first circuit configured to receive an inverted output clock signal and a data signal and generate a first signal through a first node;
a second circuit configured to receive the data signal, an input clock signal, and an output signal, generate the first signal by being connected to the first circuit through the first node, and generate the inverted output clock signal through a second node;
a third circuit configured to generate the inverted output clock signal by being connected to the second circuit through the second node; and
a fourth circuit configured to receive the first signal and generate an output signal and an inverted output signal,
wherein the second circuit comprises a pair of transistors receiving the input clock signal.

19. The latch circuit of claim 18, wherein the latch circuit generates the output signal in response to a negative edge of the input clock signal.

* * * * *